(12) United States Patent
Natori et al.

(10) Patent No.: US 7,205,056 B2
(45) Date of Patent: Apr. 17, 2007

(54) CERAMIC FILM AND METHOD OF MANUFACTURING THE SAME, FERROELECTRIC CAPACITOR, SEMICONDUCTOR DEVICE, AND OTHER ELEMENT

(75) Inventors: Eiji Natori, Suwa (JP); Takeshi Kijima, Suwa (JP); Koichi Furuyama, Higashimatsuyama (JP); Yuzo Tasaki, Higashimatsuyama (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 10/166,781

(22) Filed: Jun. 12, 2002

(65) Prior Publication Data

US 2003/0021079 A1 Jan. 30, 2003

(30) Foreign Application Priority Data

| Jun. 13, 2001 | (JP) | ............................................ | 2001-178840 |
| Jun. 26, 2001 | (JP) | ............................................ | 2001-193048 |
| Mar. 26, 2002 | (JP) | ............................................ | 2002-086139 |

(51) Int. Cl.
*B32B 9/00* (2006.01)

(52) U.S. Cl. ..................... 428/699; 428/693; 428/446
(58) Field of Classification Search ......... 428/698–702, 428/446, 448, 692, 693; 347/68; 310/328
See application file for complete search history.

(56) References Cited

U.S. PATENT DOCUMENTS 5,198,269 A    3/1993    Swartz et al.

(Continued)

FOREIGN PATENT DOCUMENTS

| CN | 1469842 A | 1/2004 |
| JP | A 5-85704 | 4/1993 |
| JP | A 7-57535 | 3/1995 |
| JP | A 08-012494 | 1/1996 |
| JP | A 8-253324 | 10/1996 |
| JP | A 10-200059 | 2/1998 |
| JP | 10209722 | * 8/1998 |
| WO | WO 02/32809 A1 | 4/2002 |

OTHER PUBLICATIONS

U.S. Appl. No. 10/166,707, filed Jun. 12, 2002, Natori et al.
Kijima et al., "New Low Temperature Processing of Metalorganic Chemical Vapor Deposition–$Bi_4Ti_3O_{12}$ Thin Films Using BiOx Buffer Layer," 38 Jpn. J. Appl. Phys. vol. 38 (1999) pp. 127–130.

(Continued)

*Primary Examiner*—Terrel Morris
*Assistant Examiner*—Arden B Sperty
(74) *Attorney, Agent, or Firm*—Oliff & Berridge, PPLC

(57) ABSTRACT

A method of manufacturing a ceramic film includes forming the ceramic film by crystallizing a ceramic raw material liquid which includes a first raw material liquid and a second raw material liquid. The first raw material liquid and the second raw material liquid are different types of liquids, the first raw material liquid is a raw material liquid for producing a ferroelectric, the second raw material liquid is a raw material liquid for producing an oxide such as an ABO-type oxide, a solvent included in the first raw material liquid and a solvent included in the second raw material liquid have different polarities, and the ceramic film is formed in a state in which the first raw material liquid and the second raw material liquid are phase separated so that first crystals formed of the first raw material liquid are intermittently formed in a surface direction of the ceramic film and second crystals formed of the second raw material liquid are formed so as to interpose between the first crystals.

7 Claims, 11 Drawing Sheets

U.S. PATENT DOCUMENTS

| | | | |
|---|---|---|---|
| 5,519,566 A | | 5/1996 | Perino et al. |
| 5,811,153 A | | 9/1998 | Hashimoto et al. |
| 5,821,005 A | * | 10/1998 | Kijima et al. ............... 428/701 |
| 5,978,207 A | | 11/1999 | Anderson et al. |
| 6,001,416 A | | 12/1999 | Moriyama et al. |
| 6,080,592 A | | 6/2000 | Paz de Araujo et al. |
| 6,172,385 B1 | * | 1/2001 | Duncombe et al. ......... 257/295 |
| 6,402,303 B1 | * | 6/2002 | Sumi ........................... 347/68 |
| 6,440,591 B1 | * | 8/2002 | Matsunaga et al. ......... 428/699 |
| 6,479,173 B1 | * | 11/2002 | Yu et al. ...................... 428/698 |
| 6,594,120 B2 | * | 7/2003 | Odagawa et al. ........... 360/313 |
| 2002/0035961 A1 | | 3/2002 | Natori et al. |
| 2004/0136891 A1 | | 7/2004 | Kijima et al. |

OTHER PUBLICATIONS

Kijima et al., "New MFIS Structure of Sol. Gel–(Bi, La)$_4$Ti$_3$O$_{12}$ with Silicon Nitride Buffer Layer;" ISAF 2000, Proceeding of the 2000 12$_{th}$ IEEE International Symposium on Applications of Ferroelectrics, pp. 653–656, Honolulu, Hawaii (Jul. 21, 2000).

Sukshind et al. "Characteristics of Pb/Sr/TiO$_3$/Pb(Zr$_{0.52}$, Ti$_{0.48}$)O$_3$/SrTiO$_3$/Si ferroelectric gate oxide structure," This Solid Films 354 (1999) 251–255.

* cited by examiner

CERAMIC FILM AND METHOD OF MANUFACTURING THE SAME, FERROELECTRIC CAPACITOR, SEMICONDUCTOR DEVICE, AND OTHER ELEMENT

BACKGROUND OF THE INVENTION

The present invention relates to a ceramic film and a method of manufacturing the same, a ferroelectric capacitor, a semiconductor device, and other elements.

As a ferroelectric film applied to semiconductor devices (ferroelectric memory (FeRAM), for example), ferroelectric films having a layered perovskite structure (BiLaTiO-based, BiTiO-based, and SrBiTaO-based ferroelectric films, for example) have been proposed. The ferroelectric film having a layered perovskite structure is generally formed by crystal growth from an amorphous state.

In the case of forming a ferroelectric film having a layered perovskite structure by using this formation method, the crystal growth rate in the c-axis direction becomes lower than that in the a-axis direction and the b-axis direction due to the crystal structure of the ferroelectric film. Specifically, crystals tend to be grown in the a-axis direction and the b-axis direction. Therefore, a ferroelectric film having a layered perovskite structure formed by using the above method has rough surface morphology. Specifically, openings (holes or grooves, for example) are formed between crystals in the resulting ferroelectric film.

BRIEF SUMMARY OF THE INVENTION

The present invention may provide a method of manufacturing a ceramic film capable of improving the surface morphology of the ceramic film.

The present invention may also provide a ceramic film obtained by the method of manufacturing a ceramic film of the present invention.

The present invention may further provide a semiconductor device and a piezoelectric device to which the ceramic film of the present invention is applied.

In a ceramic film according to one aspect of the present invention, first crystals are intermittently formed in a surface direction of the ceramic film, and second crystals are interposed between the first crystals.

A ferroelectric capacitor according one aspect to the present invention comprises:

a lower electrode, a ceramic film which is formed on the lower electrode and includes first crystals and second crystals, and an upper electrode formed on the ceramic film, wherein the first crystals are intermittently formed in a surface direction of the ceramic film, and the second crystals are formed so as to interpose between the first crystals.

A method of manufacturing a ceramic film according one aspect to the present invention comprises:

forming the ceramic film by crystallizing a ceramic raw material liquid which includes a first raw material liquid and a second raw material liquid, wherein the first raw material liquid and the second raw material liquid are different types of liquids, wherein the first raw material liquid is a raw material liquid for producing a ferroelectric, wherein the second raw material liquid is a raw material liquid for producing an ABO-type oxide, and wherein the ceramic film is formed in a state in which the first raw material liquid and the second raw material liquid are phase separated so that first crystals formed of the first raw material liquid are intermittently formed in a surface direction of the ceramic film, and second crystals formed of the second raw material liquid are formed so as to interpose between the first crystals.

The state in which the first raw material liquid and the second raw material liquid are phase separated is obtained by the following techniques.

(1) In the case where the phase separated state occurs in a liquid state after mixing due to differences in polarity, molecular weight, and the like between the first raw material liquid and the second raw material liquid, the phase separated state is obtained by depositing the mixed liquid by spin coating, dipping, an LSMCD method, or the like. In particular, the phase separated state is significantly easily obtained when the percentage of the second raw material liquid is greater than that of the first raw material liquid.

(2) In the case of using raw material liquids which are not phase separated in a mixed state, the phase separated state can be obtained by separately misting the first raw material liquid and the second raw material liquid, and supplying the mist of the first raw material liquid and the mist of the second raw material liquid at the same time by using the LSMCD method.

(3) The phase separated state can be obtained by depositing one of the first raw material liquid and the second raw material liquid by using a deposition method which enables the raw material liquid to be grown in the shape of islands, and depositing the other raw material liquid so as to interpose between the islands.

DETAILED DESCRIPTION OF THE EMBODIMENT

Method of Manufacturing Ceramic Film

Figure 1A:
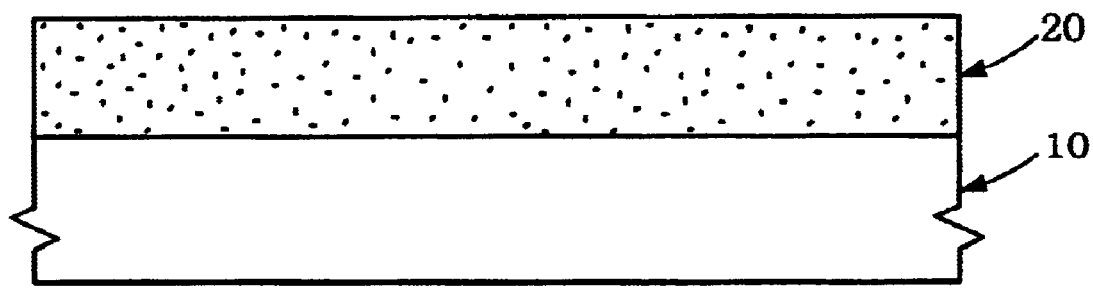
FIGS. 1A to 1C are cross-sectional views schematically showing manufacturing steps of a ceramic film using a ceramic raw material liquid according to an embodiment.

The meaning of the term "the first raw material liquid and the second raw material liquid are different types of liquids" in the present invention is described below.

(A) A first method of manufacturing a ceramic film of the present invention comprises:

forming a ceramic film by crystallizing a raw material body, wherein the raw material body includes different types of raw materials in a mixed state, and wherein the different types of raw materials differ from one another in at least one of a crystal growth condition and a crystal growth mechanism in the crystallization of the raw materials.

The different types of raw materials differ from one another in at least one of the crystal growth condition and the crystal growth mechanism. Specifically, the raw materials are judged to be different depending upon whether or not the raw materials differ from one another in at least one of the crystal growth condition and the crystal growth mechanism.

As examples of the crystal growth condition and the crystal growth mechanism in the crystallization of the raw materials, a crystallization temperature, crystal nucleus formation temperature, crystal growth temperature, crystal growth rate, crystal nucleus formation rate, size of crystal nuclei, crystallization method, and the like can be given.

In the present invention, the raw material body includes the different types of raw materials. Specifically, the raw material body includes at least two types of raw materials. The different types of raw materials differ from one another in at least one of the crystal growth condition and the crystal growth mechanism in the crystallization of the raw materials. Therefore, one of the raw materials can be crystallized before the other raw material, and the other raw material can be crystallized in openings between crystals produced from the first crystallized raw material by controlling various conditions, for example. Specifically, the openings between crystals produced from one of the raw materials can be filled with crystals produced from the other raw material. Therefore, surface morphology of the ceramic film can be improved.

The different types of raw materials may be crystallized at the same time by controlling various conditions. For example, the crystallization temperature can be adjusted by replacing a metal element of the raw material with another element. This enables the crystallization temperatures of the different types of raw materials to be approximately the same. The different types of raw materials can be crystallized at the same time if the crystallization temperatures of the different types of raw materials are approximately the same.

(B) A second method of manufacturing a ceramic film of the present invention comprises:

forming a ceramic film by crystallizing a raw material body, wherein the raw material body includes different types of raw materials in a mixed state, and wherein the different types of raw materials differ from one another in a crystal structure of crystals obtained from the raw materials.

The different types of raw materials differ from one another in the crystal structure of crystals obtained from the raw materials. Specifically, the raw materials are judged to be different when the raw materials differ from one another in the crystal structure of crystals obtained from the raw materials.

When crystals obtained from the raw materials are expressed as $(Bi_2O_2)^{2+}(A_{m-1}B_mO_{3m+1})^{2-}$, crystals having different crystal structures have different values for m, for example.

In the present invention, the different types of raw materials differ from one another in the crystal structure of crystals obtained from the raw materials. If the raw materials differ from one another in the crystal structure of crystals obtained from the raw materials, the raw materials differ from one another in the crystal growth condition and the crystal growth mechanism of the raw materials. Therefore, effects the same as in the first method of manufacturing a ceramic film of the present invention can be obtained.

(C) A third method of manufacturing a ceramic film of the present invention comprises:

forming a ceramic film by crystallizing a raw material body, wherein the raw material body includes different types of raw materials in a mixed state, and wherein the different types of raw materials are individually crystallized at least at an initial stage of crystallization.

The different types of raw materials are individually crystallized at least at an initial stage of crystallization.

In the third method of manufacturing a ceramic film of the present invention, the different types of raw materials are individually crystallized at least at an initial stage of crystallization. Therefore, crystals produced from one of the raw materials can be grown in the openings between crystals produced from the other raw material. As a result, formation of the openings between the crystals can be prevented, whereby the surface morphology is improved.

The first to third methods of manufacturing a ceramic film of the present invention may have at least any of the following features.

(a) The ceramic film may be a ferroelectric.

(b) The ceramic film may be a paraelectric.

(c) The ceramic film may include a ferroelectric and a paraelectric in a mixed state.

(d) At least two of the different types of raw materials may differ from each other in crystallization temperature in the crystallization of the raw materials.

(e) At least two of the different types of raw materials may differ from each other in crystal nucleus formation temperature in the crystallization of the raw materials.

(f) At least two of the different types of raw materials may differ from each other in crystal growth temperature in the crystallization of the raw materials.

(g) At least two of the different types of raw materials may differ from each other in crystal growth rate in the crystallization of the raw materials.

(h) At least two of the different types of raw materials may differ from each other in crystal nucleus formation rate in the crystallization of the raw materials.

(i) At least two of the different types of raw materials may differ from each other in the size of crystal nuclei in the crystallization of the raw materials.

(j) At least two of the different types of raw materials may differ from each other in crystallization method in the crystallization of the raw materials.

(k) There may be a time lag between the crystallization of the different types of raw materials.

(l) There may be a time lag between the formation of crystal nuclei in the crystallization of the raw materials.

(m) The different types of raw materials may be crystallized at the same time.

When crystallizing the different types of raw materials at the same time, crystals produced from one of the raw materials interrupt the growth of crystals produced from the other raw material. As a result, the resulting crystals can be microcrystallized. This causes the openings between the crystals to become narrow, whereby the surface morphology is improved.

When crystallizing the different types of raw materials at the same time, it is preferable to use raw materials from which ceramics having different crystal structures are obtained. This enables the crystal growth condition and the crystal growth mechanism during crystallization of the raw materials to be changed at the same time.

(n) When ceramics obtained from the raw materials are expressed as $(Bi_2O_2)^{2+}(A_{m-1}B_mO_{3m+1})^{2-}$, the different types of raw materials may have different values for m.

(o) The raw material body may be formed on a base by the liquid source misted chemical deposition (LSMCD) method.

In the case of forming the raw material body on the base by using the LSMCD method, the raw material body is provided to the base in the form of a mist by ultrasonic waves.

The raw material body may be formed on a base by separately providing the different types of raw materials.

The raw material body may be formed on a base by providing the different types of raw materials at the same time.

(p) The raw material body may be formed on a base by spin coating or dipping.

(q) The raw materials may be at least one of a sol-gel raw material and an MOD raw material.

(r) The raw material body may include a sol-gel raw material and an MOD raw material.

In the above (p) and (q), the sol-gel raw material may be polycondensed by hydrolysis.

The sol-gel raw material may have a crystal structure similar to the crystal structure of crystals obtained by crystallizing the raw material. This enables the sol-gel raw material to be easily crystallized.

The MOD raw material may be a polynuclear complex raw material.

(s) The raw material body may include different types of sol-gel raw materials, wherein the different types of sol-gel raw materials may differ from one another in the degree of polycondensation or metal element composition.

(D) A fourth method of manufacturing a ceramic film of the present invention comprises:

forming a ceramic film by crystallizing a raw material body, wherein the raw material body is crystallized so that a plurality of phases is formed.

The ceramic film may have any of the following features.
(a) The ceramic film may be a ferroelectric.
(b) The ceramic film may be a paraelectric.
(c) The ceramic film may include a ferroelectric and a paraelectric in a mixed state.

(E) A fifth method of manufacturing a ceramic film of the present invention comprises:

forming a ceramic film by crystallizing a ceramic raw material liquid which includes a first raw material liquid and a second raw material liquid, wherein the first raw material liquid and the second raw material liquid are different types of liquids, wherein the first raw material liquid is a raw material liquid for producing a ferroelectric having a Bi-type layered perovskite structure, and wherein the second raw material liquid is a raw material liquid for producing an ABO-type oxide in which Bi is provided in the A site.

A ferroelectric film having predetermined characteristics at a low temperature can be formed by forming a ceramic film using the ceramic raw material liquid of the present invention. A ceramic film obtained by using the ceramic raw material liquid of the present invention excels in surface morphology.

The molar ratio of the ferroelectric produced from the first raw material liquid to the ABO-type oxide produced from the second raw material liquid is preferably from 100:20 to 100:100. This enables a ferroelectric film having predetermined characteristics to be formed at a lower temperature more reliably.

(F) A sixth method of manufacturing a ceramic film of the present invention comprises:

forming a ceramic film by crystallizing a ceramic raw material liquid which includes a third raw material liquid and a fourth raw material liquid, wherein the third raw material liquid and the fourth raw material liquid are different types of liquids, wherein the third raw material liquid is a raw material liquid for producing a PZT-type ferroelectric, and wherein the fourth raw material liquid is a raw material liquid for producing an ABO-type oxide in which Pb is provided in the A site.

Effects the same as in the fifth method of manufacturing a ceramic film of the present invention can be obtained by forming a ceramic film using the ceramic raw material liquid of the present invention, for example.

The molar ratio of the ferroelectric produced from the third raw material liquid to the ABO-type oxide produced from the fourth raw material liquid is preferably from 100:20 to 100:100. This enables a ferroelectric film having predetermined characteristics to be formed at a lower temperature more reliably.

The third raw material liquid may be a liquid in which a metal compound or a metal-inorganic compound of a metal element for the ferroelectric is dissolved in a solvent, and the fourth raw material liquid may be a liquid in which a metal compound or a metal-inorganic compound of a metal element for the ABO-type oxide is dissolved in a solvent.

(G) A seventh method of manufacturing a ceramic film of the present invention comprises:

forming a ceramic film by crystallizing a ceramic raw material liquid which includes a fifth raw material liquid and a sixth raw material liquid, wherein the fifth raw material liquid is a raw material liquid for producing a ferroelectric having a Bi-type layered perovskite structure or a PZT-type ferroelectric, and wherein the sixth raw material liquid is a raw material liquid for producing an ABO-type oxide in which Ge or Si is provided in the B site.

Effects the same as in the fifth method of manufacturing a ceramic film of the present invention can be obtained by forming a ceramic film using the ceramic raw material liquid of the present invention, for example.

The molar ratio of the ferroelectric produced from the fifth raw material liquid to the ABO-type oxide produced from the sixth raw material liquid is preferably from 100:20 to 100:100. This enables a ferroelectric film having predetermined characteristics to be formed at a lower temperature more reliably.

(H) An eighth method of manufacturing a ceramic film of the present invention comprises:

forming a raw material body layer in which a plurality of raw material layers is layered, and forming a ceramic film by crystallizing the raw material body layer, wherein an uppermost raw material layer in the raw material body layer has a crystallization temperature lower than the crystallization temperature of a lower raw material layer which is in contact with the uppermost raw material layer.

According to the present invention, crystals produced from the uppermost raw material layer function as a seed layer during crystallization of the lower raw material layer.

The lower raw material layer which is in contact with the uppermost raw material layer may be formed on a base with a first raw material layer interposed therebetween, wherein the first raw material layer may have a crystallization temperature lower than the crystallization temperature of the lower raw material layer which is in contact with the uppermost raw material layer. Therefore, crystals produced from the first raw material layer function as a seed layer during crystallization of the lower raw material layer which is in contact with the uppermost raw material layer.

(I) A ninth method of manufacturing a ceramic film of the present invention comprises:

forming a raw material body layer which includes a raw material stack in which a first raw material layer, a second raw material layer, and a third raw material layer are sequentially layered, and forming a ceramic film by crystallizing the raw material body layer, wherein the second raw material layer has a crystallization temperature lower than the crystallization temperatures of the first raw material layer and the third raw material layer.

According to the present invention, crystals produced from the second raw material layer function as a stopper for preventing the growth of crystals in the first raw material layer and the third raw material layer. Therefore, the grain size of the crystals produced from the first raw material layer and the third raw material layer can be decreased.

A fourth raw material layer may be further layered on the third raw material layer, wherein the fourth raw material layer may have a crystallization temperature lower than the crystallization temperature of the third raw material layer. In this case, crystals produced from the fourth raw material layer function as a seed layer during crystallization of the third raw material layer.

(J) A tenth method of manufacturing a ceramic film of the present invention comprises:

forming a raw material body layer in which a plurality of raw material layers is layered, and forming a ceramic film by crystallizing the raw material body layer, wherein an uppermost raw material layer in the raw material body layer has a crystallization temperature higher than the crystallization temperature of a lower raw material layer which is in contact with the uppermost raw material layer.

According to the present invention, crystals produced from the uppermost raw material layer can be formed to cover crystals produced from the lower raw material layer.

Crystals obtained from the uppermost raw material layer in the raw material body layer preferably have no layered structure. This enables the surface morphology of the ceramic film to be improved.

In the first to tenth methods of manufacturing a ceramic film of the present invention, the step of forming a ceramic film by crystallizing the raw material body may be performed two or more times.

Ceramic Film

A ceramic film of the present invention is obtained by the method of manufacturing a ceramic film of the present invention.

A ceramic film of the present invention comprises:

a stack in which a first crystal layer and a second crystal layer are sequentially layered, wherein the second crystal layer has a melting point lower than a melting point of the first crystal layer.

In the present invention, a constituent metal element of the first crystal layer and a constituent metal element of the second crystal layer may be mixed in a region around an interface between the first crystal layer and the second crystal layer.

In the present invention, the first crystal layer may be formed on a base with a third crystal layer interposed therebetween, and the third crystal layer may have a melting point lower than a melting point of the first crystal layer.

A ceramic film of the present invention comprises:

a crystal stack in which a first crystal layer, a second crystal layer, and a third crystal layer are sequentially layered, wherein the second crystal layer has a melting point lower than melting points of the first crystal layer and the third crystal layer.

In the present invention, a constituent metal element of the first crystal layer and a constituent metal element of the second crystal layer may be mixed in a region around an interface between the first crystal layer and the second crystal layer, and a constituent metal element of the second crystal layer and a constituent metal element of the third crystal layer may be mixed in a region around an interface between the second crystal layer and the third crystal layer.

In the present invention, a fourth crystal layer may be further provided on the third crystal layer, the fourth crystal layer may have a melting point lower than a melting point of the third crystal layer, and a constituent metal element of the third crystal layer and a constituent metal element of the fourth crystal layer may be mixed in a region around an interface between the third crystal layer and the fourth crystal layer.

A ceramic film of the present invention comprises:

a stack in which a first crystal layer and a second crystal layer are sequentially layered, wherein the second crystal layer has a melting point higher than a melting point of the first crystal layer.

In the present invention, a constituent metal element of the first crystal layer and a constituent metal element of the second crystal layer may be mixed in a region around an interface between the first crystal layer and the second crystal layer.

Application Example of Ceramic Film

A semiconductor device of the present invention comprises a capacitor including the ceramic film of the present invention.

The ceramic film of the present invention may be applied to various types of devices, other than a semiconductor device, such as a piezoelectric of a piezoelectric device.

The present invention may further provide a ferroelectric capacitor and a method of manufacturing a ceramic film given below.

A ferroelectric capacitor of the present invention comprises:

a lower electrode, a ceramic film which is formed on the lower electrode and includes first crystals and second crystals, and an upper electrode formed on the ceramic film, wherein the first crystals have a Bi-based layered perovskite structure, wherein the second crystals are ABO-type oxides in which Bi is provided in an A site, and wherein the first crystals are intermittently formed in a surface direction of the ceramic film, and the second crystals are formed so as to interpose between the first crystals.

The ceramic film which makes up this ferroelectric capacitor may be formed by a first method given below.

The first method comprises:

forming the ceramic film by crystallizing a ceramic raw material liquid which includes a first raw material liquid and a second raw material liquid, wherein the first raw material liquid and the second raw material liquid are different types of liquids, wherein the first raw material liquid is a raw material liquid for producing a ferroelectric having a Bi-based layered perovskite structure, and the second raw material liquid is a raw material liquid for producing an ABO-type oxide in which Bi is provided in an A site, wherein a solvent included in the first raw material liquid and a solvent included in the second raw material liquid have different polarities, and wherein the ceramic film is formed in a state in which the first raw material liquid and the second raw material liquid are phase separated so that first crystals formed of the first raw material liquid are intermittently formed in a surface direction of the ceramic film, and second crystals formed of the second raw material liquid are formed so as to interpose between the first crystals.

The ceramic film which makes up the ferroelectric capacitor may be formed by a second method given below.

The second method comprises:

forming the ceramic film by crystallizing a ceramic raw material liquid which includes a first raw material liquid and a second raw material liquid, wherein the first raw material liquid and the second raw material liquid are different types of liquids, wherein the first raw material liquid is a raw material liquid for producing a ferroelectric having a Bi-based layered perovskite structure, and the second raw material liquid is a raw material liquid for producing an ABO-type oxide in which Bi is provided in an A site, wherein a solvent included in the first raw material liquid and a solvent included in the second raw material liquid have different polarities, and wherein a mist produced from the first raw material liquid is formed so as to be dispersed on a base and then a film of the second raw material liquid is formed on the base so that first crystals formed of the first raw material liquid are intermittently formed in a surface direction of the ceramic film, and second crystals formed of the second raw material liquid are formed so as to interpose between the first crystals.

In the second method, as the method of forming the film of the second raw material liquid on the base on which the mist of the first raw material liquid is dispersed, a method of forming the film of the second raw material liquid by misting the second raw material liquid, or a method of forming the film of the second raw material liquid by spin coating may be used. These methods also apply to a second method described later. The phase separation effect is increased if the film of the first raw material liquid is formed in the shape of islands.

The first and second methods may have the following features. These features also apply to first and second methods described later.

(a) One of the solvents included in the first raw material liquid and the second raw material liquid may be soluble in water, and the other of the solvents may be insoluble in water.

(b) The molar ratio of the ferroelectric produced from the first raw material liquid to the ABO-type oxide produced from the second raw material liquid may be from 100:20 to 100:100.

A ferroelectric capacitor of the present invention comprises:

a lower electrode, a ceramic film which is formed on the lower electrode and includes first crystals and second crystals, and an upper electrode formed on the ceramic film, wherein the first crystals have a PZT-type perovskite structure, wherein the second crystals are ABO-type oxides in which Pb is provided in an A site, and wherein the first crystals are intermittently formed in a surface direction of the ceramic film, and the second crystals are formed so as to interpose between the first crystals.

The ceramic which makes up this ferroelectric capacitor may be formed by a method similar to the above first and second methods.

Specifically, a first method comprises:

forming the ceramic film by crystallizing a ceramic raw material liquid which includes a third raw material liquid and a second raw material liquid, wherein the first raw material liquid and the second raw material liquid are different types of liquids, wherein the first raw material liquid is a raw material liquid for producing a PZT-type ferroelectric, wherein the second raw material liquid is a raw material liquid for producing an ABO-type oxide in which Pb is provided in an A site, wherein a solvent included in the first raw material liquid and a solvent included in the second raw material liquid have different polarities, and wherein the ceramic film is formed in a state in which the first raw material liquid and the second raw material liquid are phase separated so that first crystals formed of the first raw material liquid are intermittently formed in a surface direction of the ceramic film, and second crystals formed of the second raw material liquid are formed so as to interpose between the first crystals.

A second method comprises:

forming the ceramic film by crystallizing a ceramic raw material liquid which includes a first raw material liquid and a second raw material liquid, wherein the first raw material liquid and the second raw material liquid are different types of liquids, wherein the first raw material liquid is a raw material liquid for producing a PZT-type ferroelectric, wherein the second raw material liquid is a raw material liquid for producing an ABO-type oxide in which Pb is provided in an A site, wherein a solvent included in the first raw material liquid and a solvent included in the second raw material liquid have different polarities, and wherein a mist produced from the first raw material liquid is formed so as to be dispersed on a base and then a film of the first raw material liquid is formed on the base so that first crystals formed of the second raw material liquid are intermittently formed in a surface direction of the ceramic film, and second crystals formed of the second raw material liquid are formed so as to interpose between the first crystals.

In the second method, as the method of forming the film of the second raw material liquid on the base on which the mist of the first raw material liquid is dispersed, a method of forming the film of the second raw material liquid by misting the second raw material liquid, or a method of forming the film of the second raw material liquid by spin coating may be used. The phase separation effect is increased if the film of the first raw material liquid is formed in the shape of islands.

The above first and second methods may have the following features.

(a) One of the solvents included in the first raw material liquid and the second raw material liquid may be soluble in water, and the other of the solvents may be insoluble in water.

(b) The molar ratio of the ferroelectric produced from the first raw material liquid to the ABO-type oxide produced from the second raw material liquid may be from 100:20 to 100:100.

A ferroelectric capacitor of the present invention comprises:

a lower electrode, a ceramic film which is formed on the lower electrode and includes first crystals and second crystals, and an upper electrode formed on the ceramic film, wherein the first crystals are intermittently formed in a surface direction of the ceramic film, and the second crystals are formed so as to interpose between the first crystals.

A first method for forming the ceramic film which makes up this ferroelectric capacitor comprises:

forming the ceramic film by crystallizing a ceramic raw material liquid which includes a first raw material liquid and a second raw material liquid, wherein the first raw material liquid and the second raw material liquid are different types of liquids, wherein the first raw material liquid is a raw material liquid for producing a ferroelectric, wherein the second raw material liquid is a raw material liquid for producing an ABO-type oxide, wherein a solvent included in the first raw material liquid and a solvent included in the second raw material liquid have different polarities, and wherein the ceramic film is formed in a state in which the first raw material liquid and the second raw material liquid are phase separated so that first crystals formed of the first raw material liquid are intermittently formed in a surface direction of the ceramic film, and second crystals formed of the second raw material liquid are formed so as to interpose between the first crystals.

A second method for forming the ceramic film which makes up the ferroelectric capacitor comprises:

forming a ceramic film by crystallizing a ceramic raw material liquid which includes a first raw material liquid and a second raw material liquid, wherein the first raw material liquid and the second raw material liquid are different types of liquids, wherein the first raw material liquid is a raw material liquid for producing a ferroelectric, wherein the second raw material liquid is a raw material liquid for producing an ABO-type oxide, wherein a solvent included in the first raw material liquid and a solvent included in the second raw material liquid have different polarities, and wherein a mist produced from the first raw material liquid is formed so as to be dispersed on a base and then a film of the second raw material liquid is formed on the base so that first crystals formed of the first raw material liquid are intermittently formed in a surface direction of the ceramic film, and second crystals formed of the second raw material liquid are formed so as to interpose between the first crystals.

There are no specific limitations to the first raw material liquid and the second raw material liquid insofar as the liquids have the above configuration, and various types of combinations are possible. Specifically, these manufacturing methods may be applied not only to the case of the ferroelectric having a Bi-based layered perovskite structure or a PZT-type perovskite structure, but also to the case where the first raw material liquid is a raw material liquid for producing a ferroelectric having a Bi-based layered perovskite structure or a PZT-type ferroelectric, and the second raw material liquid is a raw material liquid for producing an ABO-type oxide in which Ge, Si, or Sn, or combination of these is provided in the B site.

According to the first and second methods, first crystals produced from the first or third raw material liquid are intermittently formed, and second crystals produced from the second or fourth raw material liquid are formed so as to interpose between the first crystals. As a result, the second crystals (paraelectric, for example) are disposed to surround the first crystals (ferroelectric, for example). In such a structure, occurrence of domains in the direction at an angle of 90° with respect to the direction of the thickness of the ferroelectric film of the ferroelectric capacitor consisting of the upper and lower electrodes and the ferroelectric (generally called 90° domains) can be prevented. As a result, squareness of the hysteresis characteristics of the ferroelectric capacitor can be improved.

The above-described first and second methods may be applied not only to the case of forming a ceramic film of a ferroelectric capacitor but also to the case of forming a ceramic film used for other applications.

Embodiments of the present invention are described below in more detail with reference to the drawings.

First Embodiment

Method of Manufacturing Ceramic Film

A method of manufacturing a ceramic film according to the present embodiment is described below. FIG. 1 is a cross-sectional view schematically showing manufacturing steps of a ceramic film according to the present embodiment. FIG. 1B is a conceptual view showing a concept of a crystallization mechanism.

Figure 1B:
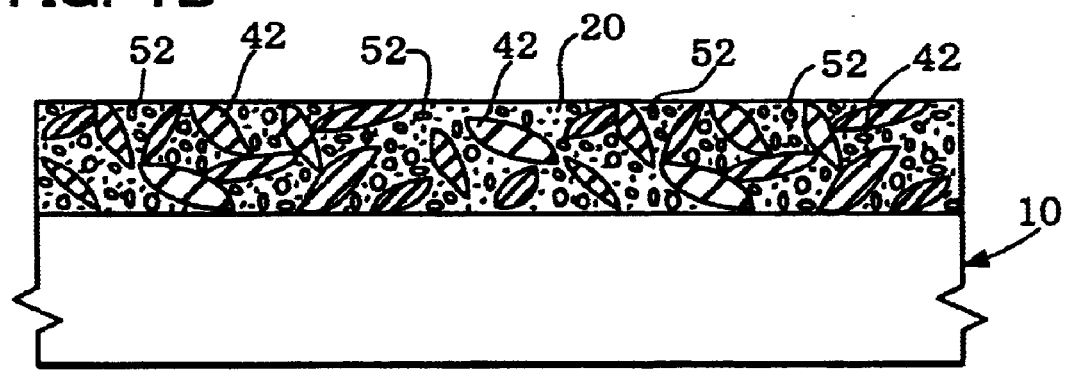

(1) As shown in FIG. 1A, a raw material body 20 is formed on a base 10. As a method for forming the raw material body 20 on the base 10, a coating method, an LSMCD method, and the like can be given. As examples of the coating method, spin coating and dipping can be given. The raw material body 20 includes a sol-gel raw material and an MOD raw material. As the sol-gel raw material, a raw material having a crystallization temperature lower than that of the MOD raw material and a crystal nucleus formation rate and a crystal growth rate higher than those of the MOD raw material is selected.

The sol-gel raw material may be prepared as described below. Metal alkoxides having four or less carbon atoms are mixed and subjected to hydrolysis and polycondensation. A strong M-O-M-O . . . bond is formed by hydrolysis and polycondensation. The resulting M-O-M bond has a structure similar to the crystal structure of a ceramic (perovskite structure). M represents a metal element (Bi, Ti, La, Pb, for example), and O represents oxygen. Metal elements and the ratio of the metal elements are appropriately determined depending on a desired ceramic. Taking a BiLaTiO-based (hereinafter called "BLT") ceramic as an example, the ratio is expressed as $Bi_{3.25}La_{0.75}Ti_3O_X$. The value X for O is not a final value. A solvent is added to the product obtained by hydrolysis and polycondensation to obtain a raw material. The sol-gel raw material is prepared in this manner.

As examples of the MOD raw material, a polynuclear metal complex raw material in which constituent elements for a ceramic are continuously connected to each other either directly or indirectly can be given. As examples of the MOD raw material, metal salts of carboxylic acids can be given. As examples of carboxylic acids, acetic acid, 2-ethylhexanoic acid, and the like can be given. As examples of metals, Bi, Ti, La, and Pb can be given. The MOD raw material (polynuclear metal complex raw material) has an M-O bond in the same manner as in the sol-gel raw material. However, the M-O bond is not a continuous bond as in the case of the sol-gel raw material obtained by polycondensation. The bond structure of the M-O bond is similar to a linear structure, and completely differs from the perovskite structure.

The raw material body 20 is optionally dried.

Figure 1C:
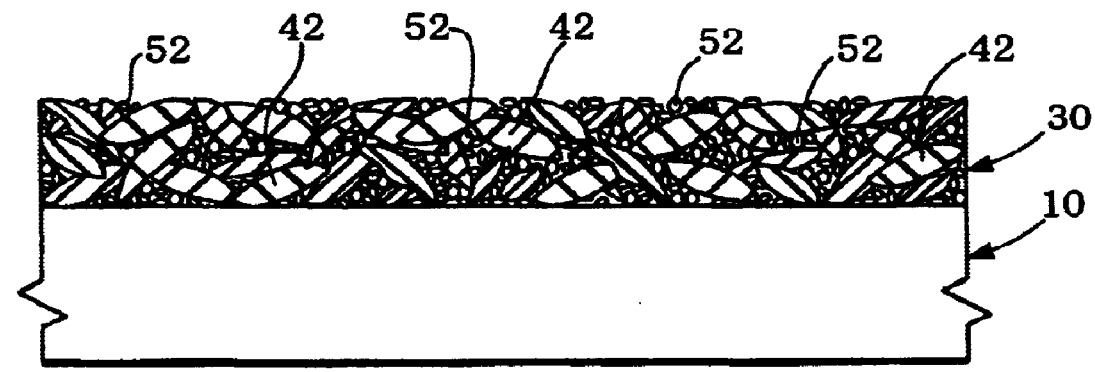

(2) The raw material body 20 is crystallized by subjecting the raw material body 20 to a thermal treatment, thereby forming a ceramic film 30 as shown in FIG. 1C. The raw material body 20 is crystallized under conditions whereby the sol-gel raw material and the MOD raw material are individually crystallized at least at an initial stage of the crystal growth so that first crystals 42 are produced from the sol-gel raw material and second crystals 52 are produced from the MOD raw material.

An example of the crystallization mechanism of the sol-gel raw material and the MOD raw material is described below. The sol-gel raw material has a crystallization temperature lower than that of the MOD raw material. The crystal nucleus formation rate and the crystal growth rate of the sol-gel raw material are higher than those of the MOD raw material. Therefore, the sol-gel raw material can be crystallized before the MOD raw material by controlling the temperature and the like. Since the sol-gel raw material is crystallized before the MOD raw material, the MOD raw material remains in the openings between the first crystals 42 produced from the sol-gel raw material, as shown in FIG. 1B. Therefore, the second crystals 52 produced from the MOD raw material are grown in the openings between the first crystals 42 produced from the sol-gel raw material. The first crystals 42 and the second crystals 52 are individually grown in this manner. Specifically, the second crystals 52 are grown so that the openings between the first crystals 42 are filled with the second crystals 52. Moreover, the sol-gel raw material and the MOD raw material differ from each other in a direction in which the crystals tend to be oriented. Therefore, the first crystals 42 and the second crystals 52 interrupt the growth of the other, whereby the crystals are easily microcrystallized. If the crystals are microcrystallized, openings between the crystals are reduced. As a result, the ceramic film 30 with improved surface morphology can be formed.

Specific crystallization conditions for the raw material body are described below.

As the thermal treatment method, a method of annealing the raw material body by rapid thermal annealing (RTA) and furnace annealing (FA) in an oxygen atmosphere can be given.

More specific crystallization conditions for the raw material body are described below. The raw material body is annealed at a temperature of 500 to 650° C. for a short period of time (5 to 30 seconds) by RTA, whereby microcrystal nuclei are produced. At this time, crystal nuclei are first produced from the sol-gel raw material. During the growth of the crystals produced from the sol-gel raw material, crystal nuclei produced from the MOD raw material are grown around the crystals produced from the sol-gel raw material. Crystallization is promoted by FA at 600 to 650° C. for 10 to 30 minutes to obtain the ceramic film 30.

Modification

The following modifications are applicable to the method of manufacturing a ceramic film according to the above embodiment.

(1) The combination of the raw materials is not limited to the above embodiment. For example, combinations given below may be employed.

1) A plurality of sol-gel raw materials with different degrees of polycondensation may be used in combination. If the degrees of polycondensation differ, directions in which the crystal growth tends to proceed generally differ even if the compositions are the same. Therefore, if the raw materials with different degrees of polycondensation are mixed, the raw materials interrupt the crystal growth of the other since the directions in which the crystal growth tends to proceed differ. As a result, the crystals are microcrystallized.

2) Raw materials having compositions for different crystal structures may be used in combination. For example, raw materials which have the following relation may be used.

When ceramics obtained from the raw materials are expressed as $(Bi_2O_2)^{2+}(A_{m-1}B_mO_{3m+1})^{2-}$, raw materials having different values for m may be used. As an example of compounds in which m=1, $Bi_2WO_6$ can be given. As an example of compounds in which m=2, $Bi_3TiNbO_9$ can be given. As an example of compounds in which m=3, $Bi_4Ti_3O_{12}$ can be given. These compounds are all ferroelectrics, but have different crystal structures. Specifically, although there are small differences in length in the a-axis direction and the b-axis direction, the length in the c-axis direction is 16.4 angstroms (1.64 nm) when m=1, 25.0 angstroms (2.50 nm) when m=2, and 32.8 angstroms (3.28 nm) when m=3. Since these compounds have different crystal structures, the raw materials which produce these crystals differ from one another in the crystal growth condition and the crystal growth mechanism.

In the case of using raw materials having compositions for different crystal structures, it is preferable that an element in the B site be common between the different raw materials for the following reasons. Specifically, even if the different raw materials are individually crystallized by allowing the crystal growth condition and the crystal growth mechanism to be different, interdiffusion occurs to a large extent near the crystal grain boundary during the subsequent long annealing step. In this case, if an element in the B site is replaced, characteristics of the ceramics tend to deteriorate.

3) A raw material which produces crystals having the crystal structure $Bi_4Ti_3O_9$ (hereinafter called "BTO raw material") and a raw material which produces crystals having the crystal structure $PbTiO_3$ (hereinafter called "PTO raw material") may be used in combination. $PbTiO_3$ is a perovskite having a tetragonal structure. However, since PTO has a small difference in length between the a-axis and the c-axis, PTO has a small degree of crystal growth anisotropy caused by the crystal structure. Moreover, crystal nuclei are easily produced from the PTO raw material at a comparatively low temperature. Therefore, in the case of mixing the BTO raw material with the PTO raw material at a lower ratio (about 10:1, for example) and allowing the crystals to be grown, these materials interrupt the crystal growth of the other. This causes the resulting crystals to be microcrystallized. This effect is more significant than in the case of crystals having the same layered perovskite structure.

4) A raw material which produces ferroelectric crystals and a raw material which produces paraelectric crystals may be used in combination. The amount of raw materials to be mixed is determined depending on the characteristics of the desired ceramic film.

5) A sol-gel raw material and an MOD raw material may be used in combination so that crystals having different crystal structures are produced from the raw materials.

6) Sol-gel raw materials with different degrees of polycondensation may be used in combination so that crystals having different crystal structures are produced from the raw materials.

(2) A ceramic film may be formed by repeatedly performing the method of manufacturing a ceramic film according to the present invention two or more times. A ceramic film may be formed by combining the method of manufacturing a ceramic film according to the present invention and a conventional method of manufacturing a ceramic film.

Figure 3:
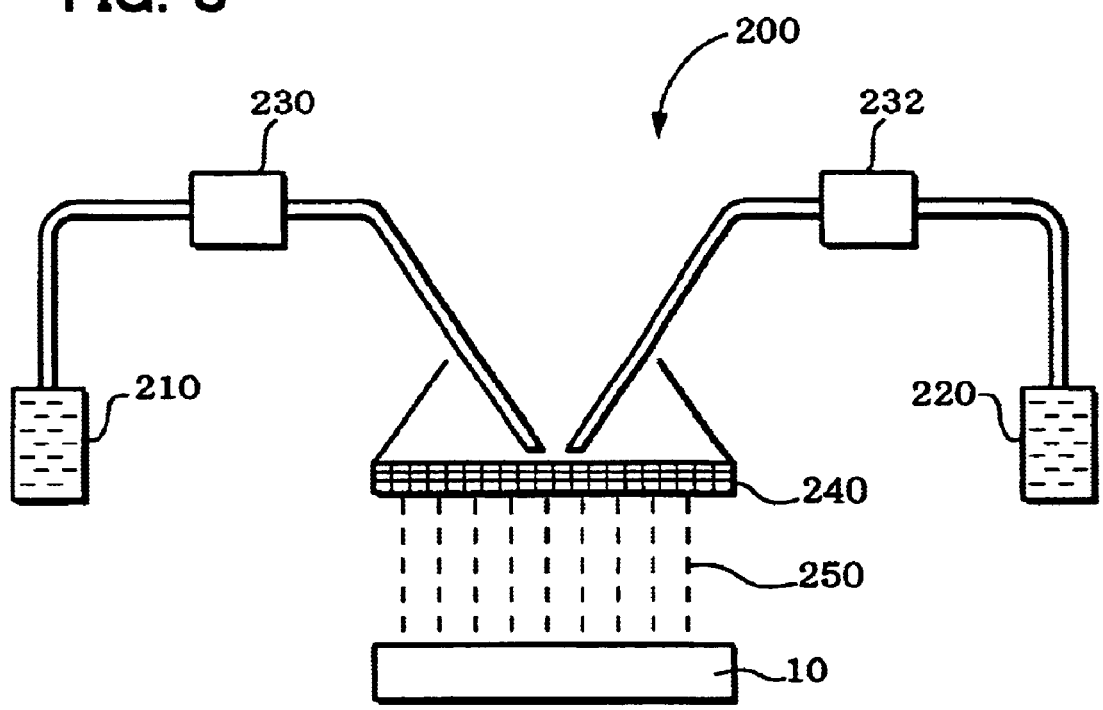
FIG. 3 is a cross-sectional view schematically showing an apparatus for forming a raw material body on a base by using an LSMCD method.

(3) As a method for forming the raw material body on the base by using the LSMCD method, the following method can be given. FIG. 3 is a cross-sectional view schematically showing an apparatus 200 for forming the raw material body on the base by using the LSMCD method.

A first raw material 210 is sent to a mesh 240 through an atomizer 230. The first raw material 210 passing through the mesh 240 forms a mist 250 and is supplied to the base 10. A second raw material 220 is sent to the mesh 240 through an atomizer 232. The second raw material 220 passing through the mesh 240 forms the mist 250 and is supplied to the base 10. A raw material body is formed by allowing the mist 250 to be repeatedly deposited on the base 10. The diameter of droplets of the mist 250 is 10 to 200 nm, for example.

The first raw material 210 and the second raw material 220 may be supplied to the base 10 at the same time. The first raw material 210 and the second raw material 220 may be supplied alternately.

Figure 4A:
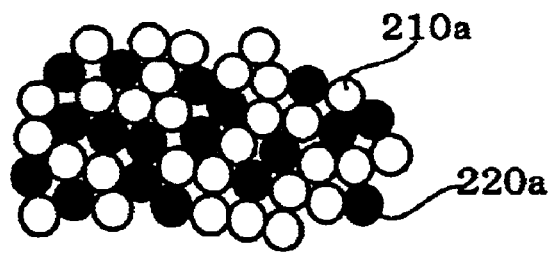
FIGS. 4A and 4B are conceptual views schematically showing a raw material body obtained by using the apparatus shown in FIG. 3.

In the case of supplying the first raw material 210 and the second raw material 220 to the base 10 at the same time, the resulting raw material body has a structure in which first mist droplets 210a produced from the first raw material 210 and second mist droplets 220a produced from the second raw material 220 are mixed as shown in FIG. 4A, for example.

Figure 4B:
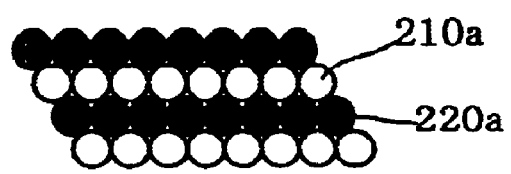

In the case of alternately supplying the first raw material 210 and the second raw material 220, the resulting raw material body has a structure in which each of the first mist droplets 210a produced from the first raw material 210 and the second mist droplets 220a produced from the second raw material 220 makes up one layer, as shown in FIG. 4B, for example. In other words, each layer is formed by the mist droplets produced from the same raw material.

In the case of alternately supplying the first raw material liquid 210 and the second raw material liquid 220, different crystal structures can be formed in a single layer from the mist droplets produced from different raw materials by using the following method.

Figure 12:
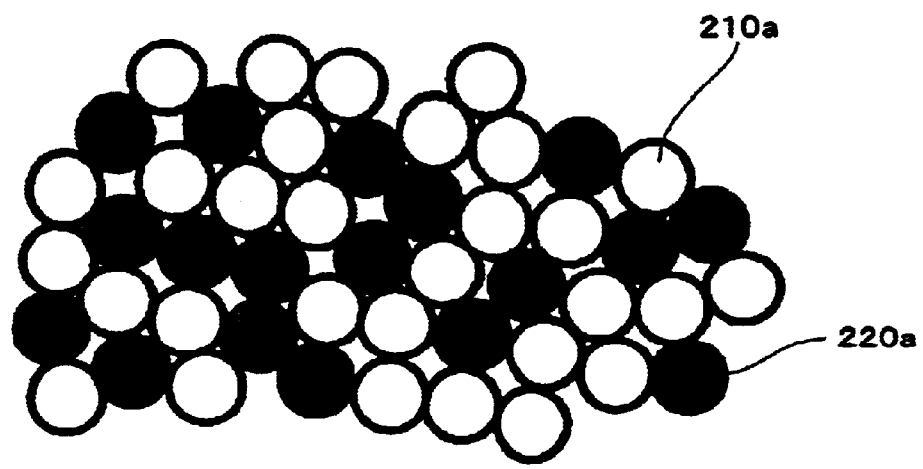
FIG. 12 is a plan view schematically showing a manufacturing step of a ceramic film according to an embodiment.

As shown in FIGS. 3 and 12, after supplying the first mist droplets 210a produced from the first raw material liquid 210 to the base 10 so as to be dispersed on the base 10, the first mist droplets 210a are heated so that a solvent contained in the first mist droplets 210a is evaporated. The first mist droplets 210a are dispersed on the base 10 at this stage.

The second mist droplets 220a can be interposed between the first mist droplets 210a by supplying the second mist droplets 220a produced from the second raw material liquid 220 in this state.

Figure 13:
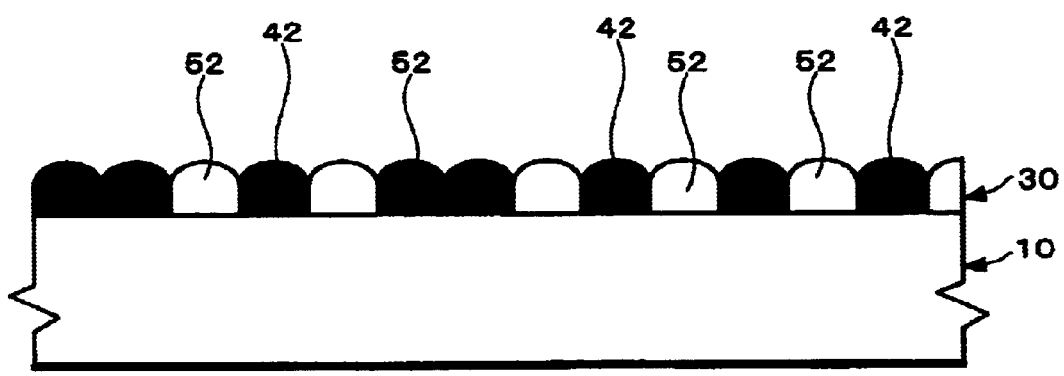
FIG. 13 is a cross-sectional view schematically showing a ceramic film according to an embodiment.

The first mist droplets 210a and the second mist droplets 220a are crystallized by a thermal treatment to form the ceramic film 30. As shown in FIG. 13, the ceramic film 30 consists of first crystals 42 produced from the first mist droplets 210a and second crystals 52 produced from the second mist droplets 220a. This enables a ceramic film in which at least first crystal phases are intermittently provided in the surface direction of the ceramic film to be easily obtained.

The second raw material liquid may be interposed between the first mist droplets 210a by applying the second raw material liquid by spin coating in a state in which the first mist droplets 210a are dispersed on the base 10 instead of forming the second mist droplets 220a. This method also enables a ceramic film in which at least first crystal phases are intermittently provided in the surface direction of the ceramic film to be easily obtained.

(4) In the case of using the combination of the raw materials described in the first embodiment or any of the combinations 1) to 6) of the raw materials described in the modification of the first embodiment, solvents in which the raw materials are dissolved may have different polarities. In this case, since the raw materials are easily phase separated, crystals produced from the different raw materials are easily intermittently formed in the surface direction of the ceramic film.

For example, one of the solvents may be soluble in water, and the other solvent may be insoluble in water. As a solvent soluble in water, acetate, nitrate, and the like can be given. As a solvent insoluble in water, butanol and the like can be given.

Second Embodiment

First Ceramic Raw Material Liquid

A first ceramic raw material liquid is used by mixing a first raw material liquid and a second raw material liquid. The first ceramic raw material liquid may be a raw material liquid from which a ceramic film is obtained by pyrolysis. The first raw material liquid and the second raw material liquid produce different types of materials. The first and second raw material liquids may be: 1) a liquid in which a metal organic compound (metal alkoxide, metal carboxylate, for example) or a metal inorganic compound (metal nitrate, metal chloride, for example) is dissolved in a solvent (water, alcohol, ester, aliphatic hydrocarbon, aromatic hydrocarbon, ketone, ether, mixture of these, for example); 2) a liquid obtained by subjecting a metal compound to hydrolysis, condensation, and the like in a solvent; or 3) a sol-gel liquid obtained by hydrolysis of a metal alkoxide.

The first raw material liquid and the second raw material liquid are described below in detail.

The first raw material liquid is a raw material liquid for producing a ferroelectric having a Bi-based layered perovskite structure. As examples of ferroelectrics having a Bi-based layered perovskite structure, SrBiTaO-based ferroelectrics ($SrBi_2Ta_2O_9$, for example), BiLaTiO-based ferroelectrics ($Bi_{3.25}La_{0.75}Ti_3O_{12}$, for example), and BiTiO-based ferroelectrics ($Bi_4Ti_3O_{12}$, for example) can be given. The first raw material liquid contains metal elements which make up a ferroelectric. The amount of constituent metal elements for a ferroelectric contained in the first raw material liquid is determined taking into consideration the amount of a desired ferroelectric and the ratio of the number of atoms of constituent metal elements in the desired ferroelectric.

As examples of the first raw material liquid, in the case of SrBiTaO-based ferroelectrics, a liquid in which solutions of an alkoxide of strontium, an alkoxide of bismuth, and an alkoxide of tantalum are mixed in 2-methoxyethanol can be given. The concentration of an alkoxide of strontium, an alkoxide of bismuth, and an alkoxide of tantalum in the first raw material liquid may be 0.05 mol/l, 0.1 mol/l, and 1.0 mol/l, respectively. Specifically, the concentration may be set so that 0.05 mol of an $SrBi_2Ta_2O_9$ ferroelectric is produced per liter of the first raw material liquid.

The second raw material liquid is a raw material liquid for producing an ABO-type oxide in which Bi is provided in the A site. If Bi is not provided in the A site, an element other than Bi may be positioned at the site of the Bi-type layered perovskite structure at which Bi should be positioned, whereby the characteristics of the ferroelectric film may be adversely affected. As examples of the ABO-type oxide in which Bi is provided in the A site, BiGeO-based oxides ($Bi_4Ge_3O_{12}$, for example), BiMoO-based oxides ($Bi_2MoO_6$), BiVO-based oxides ($Bi_2VO_6$), BiCrO-based oxides ($Bi_2CrO_6$), BiSiO-based oxides ($Bi_4Si_3O_{12}$), and BiWO-based oxides ($Bi_4W_3O_{12}$) can be given. These oxides may be used individually or in combination of two or more. The crystallization temperature of the crystals produced from the second raw material liquid can be changed by changing an element in the B site of the ABO-type oxide. The ABO-type oxide may be either a ferroelectric or a paraelectric. In the case of a paraelectric, an element in the B site is preferably either Si or Ge.

The second raw material liquid contains metal elements which make up the ABO-type oxide. The amount of constituent metal elements for the ABO-type oxide contained in the second raw material liquid is determined taking into consideration the amount of a desired ABO-type oxide and the ratio of the number of atoms of constituent metal elements in the desired ABO-type oxide.

As examples of the second raw material liquid, in the case of a BiGeO-based oxide, a liquid in which solutions of an alkoxide of bismuth and an alkoxide of germanium are mixed in 2-methoxyethanol can be given. The concentration of an alkoxide of bismuth and an alkoxide of germanium in the second raw material liquid may be 0.20 mol/l and 0.15 mol/l, respectively. Specifically, the concentration of an alkoxide of bismuth and an alkoxide of germanium may be set so that 0.05 mol of a $Bi_4Ge_3O_{12}$ oxide is produced per liter of the second raw material liquid.

The first raw material liquid and the second raw material liquid are preferably mixed so that the molar ratio of the ferroelectric produced from the first raw material liquid to the ABO-type oxide produced from the second raw material liquid is from 100:20 to 100:100. The reasons therefor are described in the description of examples.

Example of Manufacture of Ceramic Film

A ceramic film can be formed by using the ceramic raw material liquid of the present embodiment as described below, for example. The manufacturing process for a ceramic film is described below with reference to FIG. 1 which is a cross-sectional view schematically showing the manufacturing steps for a ceramic film in the same manner as in the first embodiment.

(a) The base 10 is subjected to a thermal treatment. This thermal treatment is performed for removing moisture present on the surface of the base 10. The thermal treatment temperature is 180° C., for example.

(b) The ceramic raw material liquid is applied to the base 10, thereby forming the ceramic raw material body layer 20. As the formation method, spin coating, dipping, and LSMCD can be given.

(c) A solvent present in the ceramic raw material body layer 20 is evaporated by a dry thermal treatment. The solvent may be evaporated in a nitrogen atmosphere. The temperature of dry thermal treatment is 160° C., for example.

(d) The ceramic raw material body layer 20 is subjected to a pyrolizing. Organic substances present in the ceramic raw material body layer 20 are decomposed by this thermal treatment. The organic substances may be decomposed in a nitrogen atmosphere. The thermal treatment temperature is 260° C., for example.

(e) The ceramic raw material body layer 20 is calcined. Crystal nuclei are formed during the calcining. Calcining may be performed by RTA in an oxygen atmosphere, for example.

(f) The ceramic raw material body layer 20 is sintered. Sintering may be performed by FA in an oxygen atmosphere, for example.

A cycle consisting of the steps (a) to (e) may be repeated two or more times.

Effect

Effects obtained by depositing a ceramic film using the ceramic raw material liquid according to the second embodiment are described below.

(1) In the case of forming a ferroelectric (SBT) film by sintering the ceramic raw material liquid consisting only of the first raw material liquid, desired characteristics (remanent polarization, for example) required for the ferroelectric film cannot be obtained at a sintering temperature of less than about 700° C.

However, in the case of forming a ceramic film by sintering the first ceramic raw material liquid in which the first raw material liquid and the second raw material liquid are mixed, desired characteristics required for the ferroelectric film can be obtained even at a sintering temperature of about 500° C. as described later. In other words, according to the present embodiment, a ferroelectric film having desired characteristics can be formed at a lower temperature.

(2) A material produced from the first raw material liquid differs from a material produced from the second raw material liquid. Therefore, a crystallization temperature at which the first raw material liquid is crystallized differs from a crystallization temperature at which the second raw material liquid is crystallized, for example. As a result, one of the raw material liquids can be crystallized prior to the other raw material liquid. Because of this, the crystals 52 produced from one of the raw material liquids can be grown between the crystals 42 produced from the other raw material liquid, as shown in FIG. 1B. Specifically, the crystals 42 produced from one of the raw material liquids and the crystals 52 produced from the other raw material liquid are individually grown so that the openings between the crystals 42 are filled with the crystals 52. As a result, a ceramic film with improved surface morphology can be formed.

(3) If the direction in which the crystals produced from the second raw material liquid tend to be oriented differs from the direction in which the crystals produced from the first raw material liquid tend to be oriented, crystal growth of the crystals produced from one of the raw material liquids is interrupted by the crystal growth of the other crystals. Therefore, crystals in the resulting ceramic film can be microcrystallized. As a result, a ceramic film with improved surface morphology can be formed.

Modification

The following modifications are applicable to the second embodiment.

(1) A ceramic film may be formed by repeatedly performing the above manufacturing steps of a ceramic film two or more times. A ceramic film may be formed by combining the above manufacturing steps of a ceramic film and manufacturing steps of a ceramic film using a conventional ceramic raw material.

(2) As an example of a method for forming the raw material body on the base by using the LSMCD method, the following method can be given. FIG. 3 is a cross-sectional view schematically showing the apparatus 200 for forming the raw material body on the base by using the LSMCD method.

The first raw material liquid 210 is sent to the mesh 240 through the atomizer 230. The first raw material liquid 210 passing through the mesh 240 forms the mist 250 and is supplied to the base 10. The second raw material liquid 220 is sent to the mesh 240 through the atomizer 232. The second raw material liquid 220 passing through the mesh 240 forms the mist 250 and is supplied to the base 10. The raw material body is formed by allowing the mist 250 to be repeatedly deposited on the base 10. The diameter of droplets of the mist 250 is 10 to 200 nm, for example.

The first raw material liquid 210 and the second raw material liquid 220 may be supplied to the base 10 at the same time. The first raw material liquid 210 and the second raw material liquid 220 may be alternately supplied.

In the case of supplying the first raw material liquid 210 and the second raw material liquid 220 to the base 10 at the same time, the resulting raw material body has a structure in which the first mist droplets 210a produced from the first raw material liquid 210 and the second mist droplets 220a produced from the second raw material liquid 220 are mixed, as shown in FIG. 4A, for example.

In the case of alternately supplying the first raw material liquid 210 and the second raw material liquid 220, the resulting raw material body may have a structure in which each of the first mist droplets 210a produced from the first raw material liquid 210 and the second mist droplets 220a produced from the second raw material liquid 220 makes up one layer, as shown in FIG. 4B, for example. In other words, each layer is formed by the mist droplets produced from the same raw material.

In the case of alternately supplying the first raw material 210 and the second raw material 220, different crystal structures can be formed in a single layer from the mist droplets produced from different raw materials by using the following method.

As shown in FIGS. 3 and 12, after supplying the first mist droplets 210a produced from the first raw material liquid 210 to the base 10 so as to be dispersed on the base 10, the first mist droplets 210a are heated so that a solvent contained in the first mist droplets 210a is evaporated. The first mist droplets 210a are dispersed on the base 10 at this stage.

The second mist droplets 220a can be interposed between the first mist droplets 210a by supplying the second mist droplets 220a produced from the second raw material liquid 220 in this state.

The first mist droplets 210a and the second mist droplets 220a are crystallized by a thermal treatment, whereby the ceramic film 30 is formed. As shown in FIG. 13, the ceramic film 30 consists of the first crystals 42 produced from the first mist droplets 210a and the second crystals 52 produced from the second mist droplets 220a. This enables a ceramic film in which at least first crystal phases are intermittently provided in the surface direction of the ceramic film to be easily obtained.

The second raw material liquid may be interposed between the first mist droplets 210a by applying the second raw material liquid by spin coating in a state in which the first mist droplets 210a are dispersed on the base 10 instead of forming the second mist droplets 220a. This method also enables a ceramic film in which at least first crystal phases are intermittently provided in the surface direction of the ceramic film to be easily obtained.

(3) In the case of using the combination of the raw materials described in the second embodiment, solvents in which the raw materials are dissolved may have different polarities. In this case, since the raw materials are easily phase separated, crystals produced from the different raw materials are easily intermittently formed in the surface direction of the ceramic film.

For example, one of the solvents may be soluble in water, and the other solvent may be insoluble in water. As a solvent soluble in water, acetate, nitrate, and the like can be given. As a solvent insoluble in water, butanol and the like can be given.

Third Embodiment

Second Ceramic Raw Material Liquid

A second ceramic raw material liquid is used by mixing a third raw material liquid and a fourth raw material liquid. The second ceramic raw material liquid may be a raw material liquid from which a ceramic film is obtained by pyrolysis. The third raw material liquid and the fourth raw material liquid produce different types of materials. The third and fourth raw material liquids may be: 1) a liquid in which a metal organic compound (metal alkoxide, metal carboxylate, for example) or a metal inorganic compound (metal nitrate, metal chloride, for example) is dissolved in a solvent (water, alcohol, ester, aliphatic hydrocarbon, aromatic hydrocarbon, ketone, ether, mixture of these, for example); 2) a liquid obtained by subjecting a metal compound to hydrolysis, condensation, and the like in a solvent; or 3) a sol-gel liquid obtained by hydrolysis of a metal alkoxide.

The third raw material liquid and the fourth raw material liquid are described below in detail.

The third raw material liquid is a raw material liquid for producing a PZT-type ferroelectric. As examples of PZT-type ferroelectrics, PbZrTiO-based ferroelectrics ($PbZr_yTi_{1-y}O_3$, for example) and PbLaZrTiO-based ferroelectrics ($Pb_{1-x}La_xZr_yTi_{1-y}O_3$, for example) can be given. The third raw material liquid contains metal elements which make up a ferroelectric. The amount of constituent metal elements for a ferroelectric contained in the third raw material liquid is determined taking into consideration the amount of the desired ferroelectric and the ratio of the number of atoms of constituent metal elements in the desired ferroelectric.

As examples of the third raw material liquid, taking a PbZrTiO-based ferroelectric as an example, a liquid in which lead acetate trihydrate, zirconium butoxide, and titanium isopropoxide are mixed in 1-methoxy-2-propanol can be given. The amount of lead acetate trihydrate, zirconium butoxide, and titanium isopropoxide is determined taking into consideration the ratio of the number of atoms of the constituent metal elements in the desired ferroelectric and the amount of the desired ferroelectric.

The fourth raw material liquid is a raw material liquid for producing an ABO-type oxide in which Pb is provided in the A site. If Pb is not provided in the A site, an element other than Pb may be positioned at the site of the PZT-type oxide at which Pb should be positioned, whereby the characteristics of the ferroelectric film may be adversely affected. As examples of the ABO-type oxide in which Pb is provided in the A site, PbGeO-based oxides ($Pb_5Ge_3O_{11}$), PbMoO-based oxides ($Pb_2MoO_5$), PbVO-based oxides ($Pb_2VO_5$), PbCrO-based oxides ($Pb_2CrO_5$), PbSiO-based oxides ($Pb_5Si_3O_{11}$), PbWO-based oxides ($Pb_2WO_5$), PbSnO-based oxides ($PbSnO_3$), and PbGeSiO-based oxides ($Pb_5Ge_2SiO_{11}$) can be given. These oxides may be used individually or in combination of two or more. The crystallization temperature of the crystals produced from the second raw material liquid can be changed by changing an element in the B site of the ABO-type oxide. The ABO-type oxide may be either a ferroelectric or a paraelectric. In the case of a paraelectric, an element in the B site is preferably one of Ge, Si, and Sn, or combination of these elements.

As examples of the fourth raw material liquid, taking a PbGeO-based oxide as an example, a liquid in which germanium ethoxide and lead butoxide are mixed in 1-methoxy-2-propanol can be given. The amount of germanium ethoxide and lead butoxide is determined taking into consideration the ratio of the number of atoms of constituent metal elements in the desired oxide and the amount of the desired oxide.

The third raw material liquid and the fourth raw material liquid are preferably mixed so that the molar ratio of the ferroelectric obtained from the third raw material liquid to the ABO-type oxide obtained from the fourth raw material liquid is from 100:20 to 100:100.

Second Example of Manufacture of Ceramic Film

A method of manufacturing a ceramic film using the second ceramic raw material liquid may be the method of manufacturing a ceramic film using the first ceramic raw material liquid.

Effect

Effects obtained by depositing a ceramic film using the ceramic raw material liquid according to the third embodiment are described below.

(1) According to the ceramic raw material liquid according to the present embodiment, a ferroelectric film having specific characteristics can be obtained at a sintering temperature lower than a sintering temperature necessary for providing the specific characteristics when forming a ferroelectric film by sintering only the third raw material liquid. In other words, according to the present embodiment, a ferroelectric film having the desired characteristics can be formed at a lower temperature.

(2) A material produced from the third raw material liquid differs from a material produced from the fourth raw material liquid. Therefore, a crystallization temperature at which the third raw material liquid is crystallized differs from a crystallization temperature at which the fourth raw material liquid is crystallized, for example. As a result, a ceramic film with improved surface morphology can be formed in the same manner as in the second embodiment.

The modifications illustrated in the second embodiment are also applicable to the third embodiment.

Fourth Embodiment

Third Ceramic Raw Material Liquid

A third ceramic raw material liquid is used by mixing a fifth raw material liquid and a sixth raw material liquid. The fifth ceramic raw material liquid may be a raw material liquid from which a ceramic film is obtained by pyrolysis. The fifth raw material liquid and the sixth raw material liquid produce different types of materials. The fifth and sixth raw material liquids may be: 1) a liquid in which a metal organic compound (metal alkoxide, metal carboxylate, for example) or a metal inorganic compound (metal nitrate, metal chloride, for example) is dissolved in a solvent (water, alcohol, ester, aliphatic hydrocarbon, aromatic hydrocarbon, ketone, ether, mixture of these, for example); 2) a liquid obtained by subjecting a metal compound to hydrolysis, condensation, and the like in a solvent; or 3) a sol-gel liquid obtained by hydrolysis of a metal alkoxide.

The fifth raw material liquid and the sixth raw material liquid are described below in more detail.

The fifth raw material liquid is a raw material liquid for producing a ferroelectric having a Bi-based layered perovskite structure or a PZT-type ferroelectric. As a ferroelectric having a Bi-based layered perovskite structure, ferroelectrics illustrated for the first ceramic raw material liquid can be given. As a PZT-type ferroelectric, PZT-type ferroelectrics illustrated for the first ceramic raw material liquid can be given. As examples of the fifth raw material liquid, in the case of a ferroelectric having a Bi-based layered perovskite structure, examples illustrated for the first raw material liquid (second embodiment) can be given. In the case of a PZT-type ferroelectric, examples illustrated for the third raw material liquid (third embodiment) can be given.

The sixth raw material liquid is a raw material liquid for producing an AGeO-based oxide. An oxide in which Ge is provided in the B site has a low melting point of about 700° C., whereby the process temperature can be decreased. As examples of an element in the A site of the AGeO-based oxide, alkaline earth metals, rare earth elements (Ce, in particular), Zr, Sr, and Bi can be given. As examples of a ZrGeO-based oxide, $ZrGeO_4$ can be given. As examples of an SrGeO-based oxide, $Sr_5Ge_3O_{11}$ can be given. As examples of the sixth raw material liquid, in the case of a BiGeO-based oxide, examples illustrated for the second raw material liquid (second embodiment) can be given. The AGeO-based oxide may be either a paraelectric or a ferroelectric.

The fifth raw material liquid and the sixth raw material liquid are preferably mixed so that the molar ratio of the ferroelectric obtained from the fifth raw material liquid to the ABO-type oxide obtained from the sixth raw material liquid is from 100:20 to 100:100.

Third Example of Manufacture of Ceramic Film

The method of manufacturing a ceramic film using the third ceramic raw material liquid may be the method of manufacturing a ceramic film using the first ceramic raw material liquid.

Effect

Effects obtained by depositing a ceramic film using the ceramic raw material liquid according to the fourth embodiment are described below.

(1) According to the ceramic raw material liquid of the present embodiment, a ferroelectric film having specific characteristics can be obtained at a sintering temperature lower than a sintering temperature necessary for providing the specific characteristics when forming a ferroelectric film by sintering only the fifth raw material liquid. In other words, according to the present embodiment, a ferroelectric film having the desired characteristics can be formed at a lower temperature.

(2) A material produced from the fifth raw material liquid differs from a material produced from the sixth raw material liquid. Therefore, a crystallization temperature at which the fifth raw material liquid is crystallized differs from a crystallization temperature at which the sixth raw material liquid is crystallized, for example. As a result, a ceramic film with improved surface morphology can be formed in the same manner as in the second embodiment.

(3) If the direction in which the crystals produced from the sixth raw material liquid tend to be oriented differs from the direction in which the crystals produced from the fifth raw material liquid tend to be oriented, the crystal growth of the crystals produced from one of the raw material liquids is interrupted by the crystal growth of the other crystals. Therefore, crystals in the resulting ceramic film can be microcrystallized. As a result, a ceramic film with improved surface morphology can be formed.

The modifications illustrated in the second embodiment are also applicable to the fourth embodiment.

Fifth Embodiment

An example of the manufacture of a multilayer ceramic film according to a fifth embodiment is described below.

Example of Manufacture of First Multilayer Ceramic Film

An example of the manufacture of a first multilayer ceramic film is described below. FIG. 5 is a cross-sectional view schematically showing the manufacturing process for the first multilayer ceramic film.

Figure 5A:
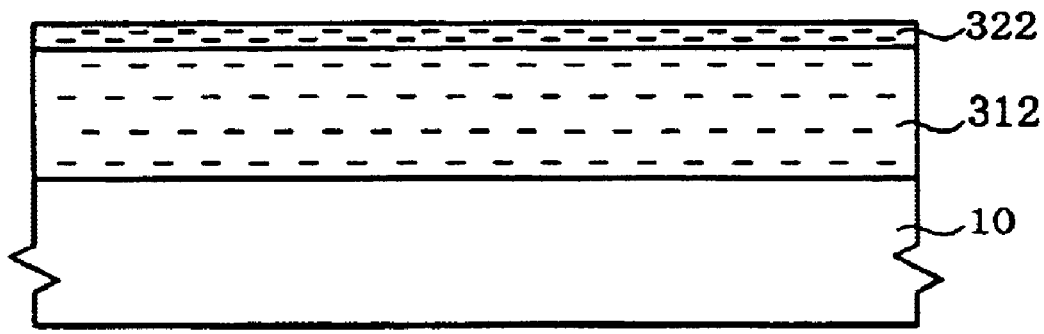
FIGS. 5A to 5C are conceptual views schematically showing manufacturing steps of a first multilayer ceramic film.

A main liquid layer 312 for producing a ferroelectric is formed on the base 10 by using a coating method, as shown in FIG. 5A. As the material for the main liquid layer 312, the first raw material liquid in the second embodiment and the third raw material liquid in the third embodiment can be given.

A secondary liquid layer 322 for producing either a ferroelectric or a paraelectric is formed on the main liquid layer 312. As the material for the secondary liquid layer 322, a material having a crystallization temperature lower than that of the material for the main liquid layer 312 is selected. In addition, a material from which an oxide having no layered structure is produced after crystallization is selected as the material for the secondary liquid layer 322. The material for the secondary liquid layer 322 differs depending upon the material for the main liquid layer 312. In the case where an SBT-type ferroelectric is formed by crystallizing the main liquid layer 312, the material for the secondary liquid layer 322 is a BiGeO-based material, BiSiO-based material, or SrGeO-based material, for example.

Figure 5B:
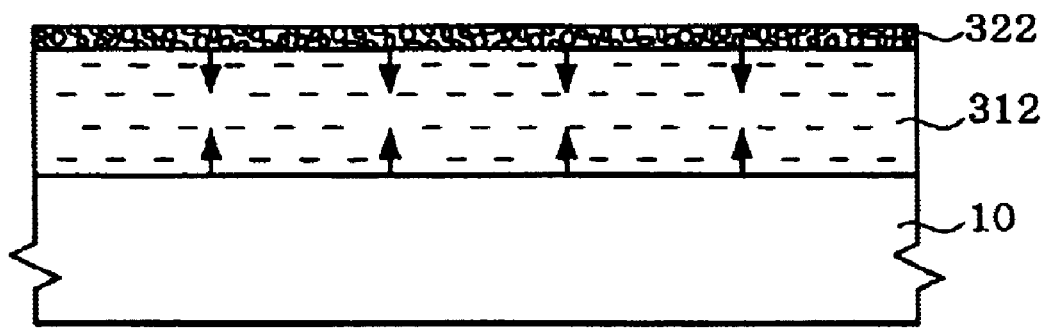
Figure 5C:
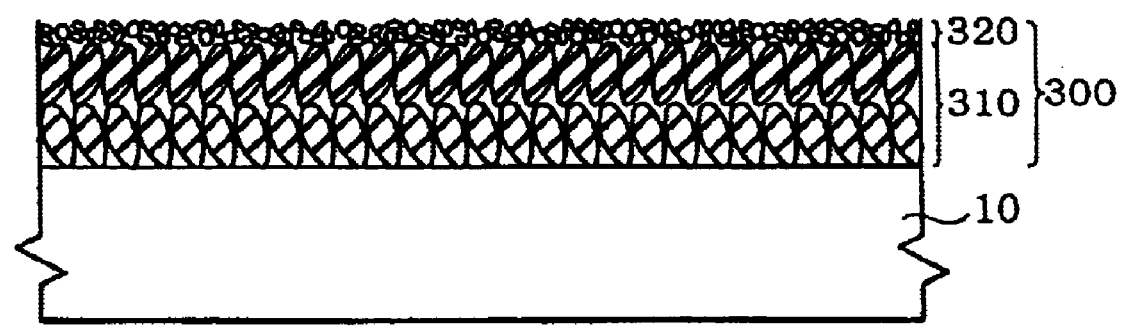

The main liquid layer 312 and the secondary liquid layer 322 are crystallized by performing a thermal treatment as shown in FIG. 5C, thereby forming a ceramic film 300 consisting of a main crystal layer 310 and a secondary crystal layer 320.

According to this example of the manufacture of the first multilayer ceramic film, the following effects are obtained.

As the material for the secondary liquid layer 322, a material having a crystallization temperature lower than that of the main liquid layer 312 is selected. Therefore, the secondary liquid layer 322 is crystallized before the main liquid layer 312 at an initial stage of crystallization, as shown in FIG. 5B. As a result, crystals produced in the secondary liquid layer 322 function as seeds during the crystallization of the main liquid layer 312. Therefore, crystallization of the main liquid layer 312 proceeds in the direction from the secondary liquid layer 322 and from the base 10. This enables the grain size of crystals produced in the main liquid layer 312 to be decreased.

A material from which an oxide having no layered structure is produced after crystallization is used as the material for the secondary liquid layer 322. Therefore, crystals are isotropically grown in the secondary liquid layer 322. As a result, a secondary crystal layer 320 with a flat surface is formed, whereby the surface morphology of the ceramic film 300 can be improved.

Figure 6A:
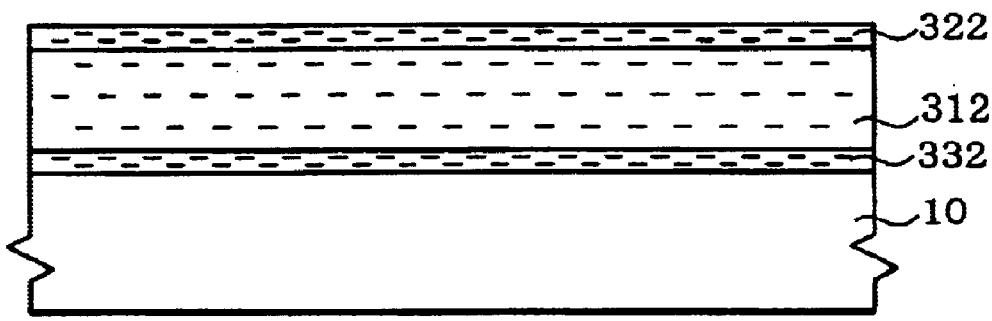
FIGS. 6A to 6C are conceptual views schematically showing manufacturing steps of a second multilayer ceramic film.
Figure 6A:
Figure 6B:
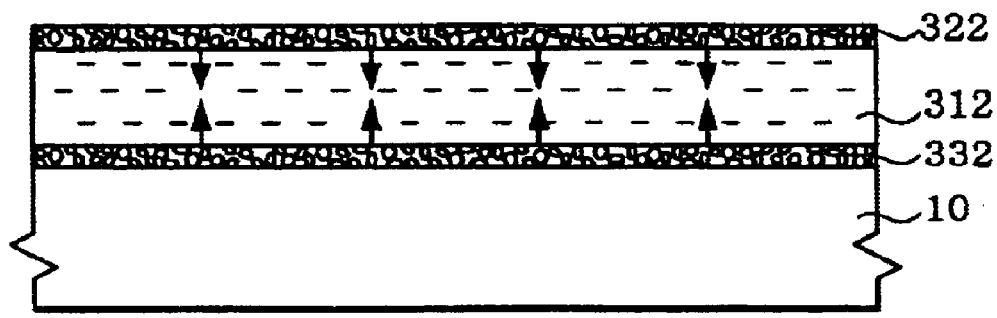
Figure 6B:
Figure 6C:
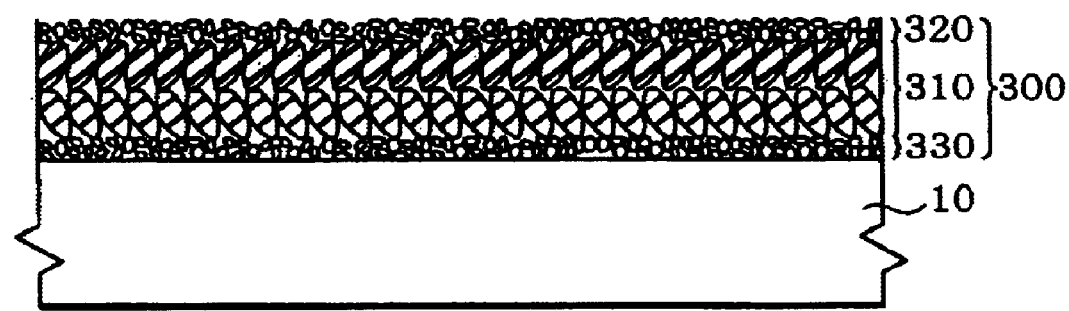

The ceramic film 300 consisting of the main crystal layer 310 and the secondary crystal layers 320 and 330 may be formed by allowing a secondary liquid layer 332 to be interposed between the base 10 and the main liquid layer 312, as shown in FIG. 6A.

Example of Manufacture of Second Multilayer Ceramic Film

Figure 7A:
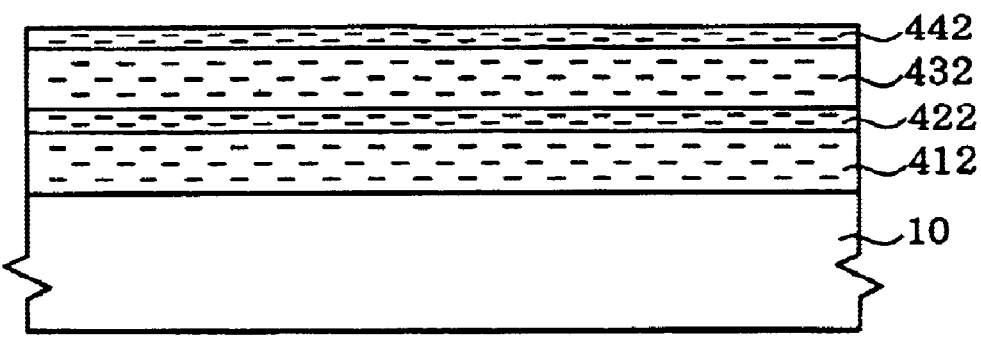
FIGS. 7A to 7C are conceptual views schematically showing manufacturing steps of a third multilayer ceramic film.
Figure 7B:
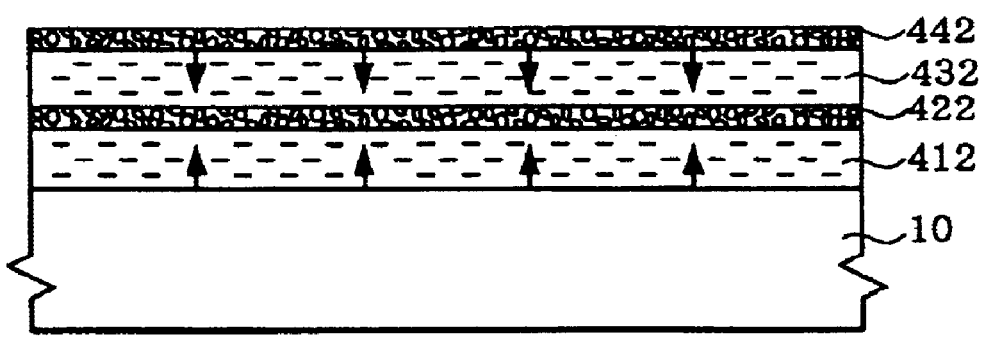
Figure 7C:
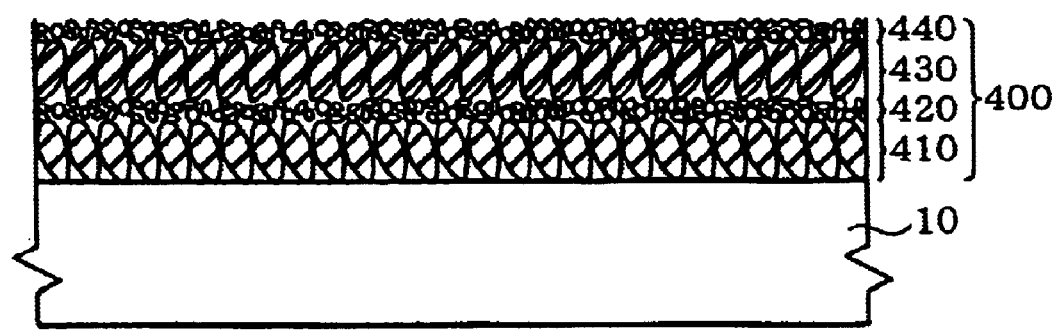

An example of the manufacture of a second multilayer ceramic film is described below. FIG. 7 is a cross-sectional view schematically showing the manufacturing process for the second multilayer ceramic film.

The example of the manufacture of the second multilayer ceramic film differs from the example of the manufacture of the first multilayer ceramic film in that a secondary liquid layer 422 is interposed between main liquid layers 412 and 432.

Specifically, the main liquid layer 412, secondary liquid layer 422, main liquid layer 432, and secondary liquid layer 442 are layered on the base 10 in that order. A ceramic film 400 consisting of main crystal layers 410 and 430 and secondary crystal layers 420 and 440 are formed by crystallizing these layers.

As the material for the secondary liquid layers 422 and 442, a material having a crystallization temperature lower than that of the main liquid layers 412 and 432 is selected in the same manner as in the example of the manufacture of the first multilayer ceramic film.

Crystals produced in the secondary liquid layer 422 function as a stopper for preventing crystal growth in the main liquid layers 412 and 432 by allowing the secondary liquid layer 422 to be interposed between the main liquid layers 412 and 432. Therefore, the grain size of crystals in the main crystal layers 410 and 430 formed on opposite sides of the secondary crystal layer 420 can be decreased.

Example of Manufacture of Third Multilayer Ceramic Film

Figure 8A:
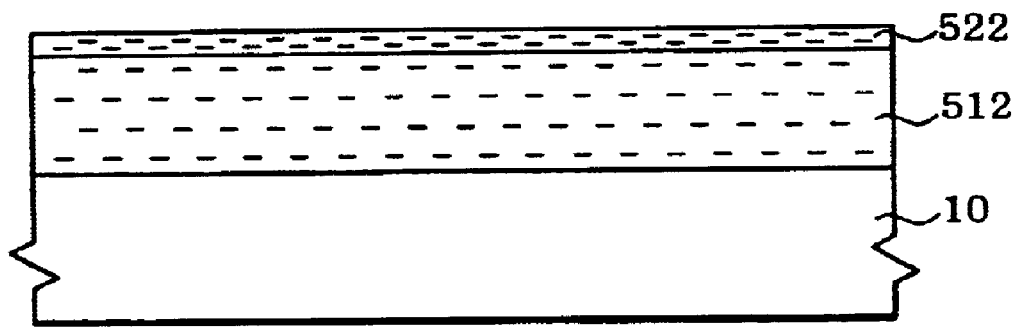
FIGS. 8A and 8B are conceptual views schematically showing manufacturing steps of a fourth multilayer ceramic film.
Figure 8A:
Figure 8B:
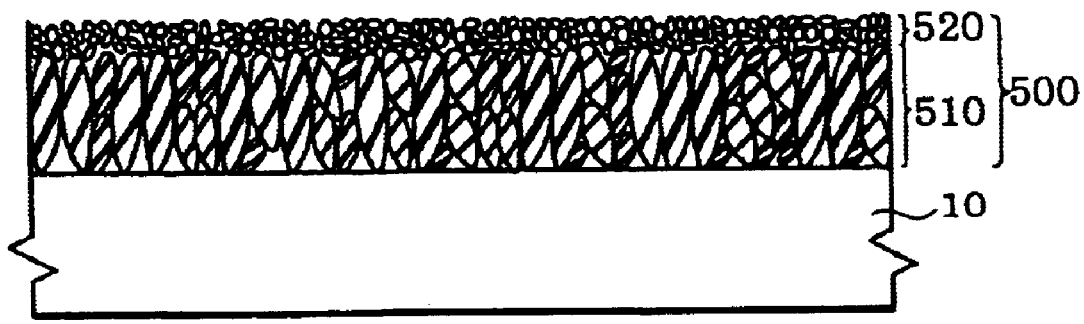

An example of the manufacture of a third multilayer ceramic film is described below. FIG. 8 is a cross-sectional view schematically showing the manufacturing process for the third multilayer ceramic film.

The example of the manufacture of the third multilayer ceramic film differs from the example of the manufacture of the first multilayer ceramic film in that a material for a main liquid layer 512 has a crystallization temperature lower than that of the material for a secondary liquid layer 522.

As the material for the main liquid layer 512, the first raw material liquid in the second embodiment and the third raw material liquid in the third embodiment can be given. In the case where the material for the main liquid layer 512 produces a PZT-type ferroelectric, the material for the secondary liquid layer 522 may be a PbWO-based material or a PbMoO-based material.

A ceramic film with improved surface morphology can be formed by crystallizing the main liquid layer 512 and the secondary liquid layer 522. The reasons therefor are as follows. The material for the main liquid layer 512 has a crystallization temperature lower than that of the material for the secondary liquid layer 522. Therefore, crystallization of the secondary liquid layer 522 proceeds after the crystallization of the main liquid layer 512, whereby the crystals produced from the secondary liquid layer 522 are grown to cover a main crystal layer 510 produced from the main liquid layer 512. Since the crystals produced from the secondary liquid layer 522 do not have a layered structure, crystals produced from the secondary liquid layer 522 are isotropically grown. Therefore, a secondary crystal layer 520 with a flat surface is formed. This decreases unevenness on the surface of a ceramic film 500, whereby the surface morphology of the ceramic film 500 can be improved.

In the above examples of the manufacture of the first to third multilayer ceramic films, crystal grains produced from the main liquid layer and crystal grains produced from the secondary liquid layer may be diffused into different crystal layers. Moreover, a constituent metal element of the main liquid layer may be diffused into the secondary liquid layer, or a constituent metal element of the secondary liquid layer may be diffused into the main liquid layer. Therefore, there may be a case where the interface between the main crystal layer produced from the main liquid layer and the secondary crystal layer produced from the secondary liquid layer is not distinguishable.

Generally, the crystallization temperature has a correlation with the melting point. Specifically, in the case where one of the crystals has a crystallization temperature higher than that of the other crystal, the crystal having a higher crystallization temperature generally has a melting point higher than that of the other crystal.

Sixth Embodiment

Semiconductor Device

Figure 2:
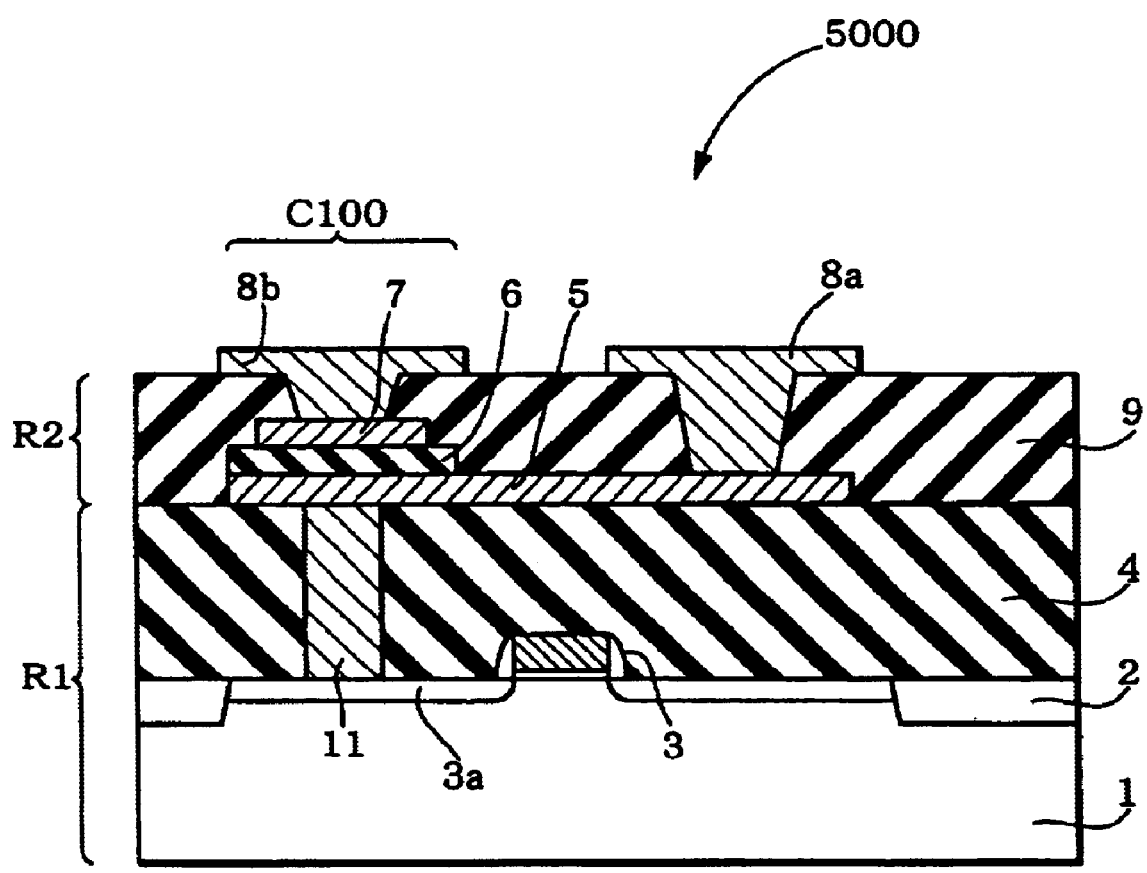
FIG. 2 is a cross-sectional view schematically showing a ferroelectric memory device.

A semiconductor device to which a ceramic film obtained by using the method of manufacturing a ceramic film of the present invention is applied is described below. The present embodiment illustrates a ferroelectric memory device as an example of the semiconductor device. FIG. 2 is a cross-sectional view schematically showing a ferroelectric memory device.

A ferroelectric memory device 5000 includes a CMOS region R1, and a capacitor region R2 formed on the CMOS region R1. The CMOS region R1 includes a semiconductor substrate 1, an element isolation region 2 and a MOS transistor 3 which are formed on the semiconductor substrate 1, and an interlayer dielectric 4. The capacitor region R2 includes a capacitor C100 consisting of a lower electrode 5, a ferroelectric film 6, and an upper electrode 7, an interconnect layer 8a connected with the lower electrode 5, an interconnect layer 8b connected with the upper electrode 7, and an insulating layer 9. The ferroelectric film 6 in the capacitor C100 is formed by using the method of manufacturing a ceramic film of the present invention. An impurity diffusion layer 3a of the MOS transistor 3 and the lower electrode 5 which makes up the capacitor are connected by a contact layer 11 formed of polysilicon or tungsten.

Effects of the ferroelectric device are described below.

(1) When forming a ferroelectric film, the thickness of the ferroelectric film must be increased in order to prevent occurrence of a short circuit between the upper electrode and the lower electrode, taking into consideration formation of grooves or holes. A short circuit between the upper electrode and the lower electrode occurs considerably when the upper electrode is formed of an iridium-based material (Ir, $IrO_2$). However, in the present embodiment, the ferroelectric film 6 of the ferroelectric device 5000 is formed by using the method of manufacturing a ceramic film of the present invention. Therefore, the ferroelectric film 6 has improved surface morphology. As a result, the thickness of the ferroelectric film 6 can be decreased to such an extent that the surface morphology of the ferroelectric film 6 is improved. Therefore, according to the ferroelectric memory device 5000, a higher degree of integration can be achieved. Moreover, since the crystals of the ferroelectric material and the crystals of the paraelectric material are intermittently dispersed in the surface direction of the ceramic film as shown in FIG. 13, hysteresis characteristics with good squareness can be obtained. This increases the SN ratio of a ferroelectric memory device in which this ceramic film is used as the capacitor film, whereby an increase in speed can be achieved.

According to the present embodiment, the range of the thickness of the ferroelectric film 6 for which an iridium-based material is used as the material for the upper electrode 7 can be increased. Specifically, the lower limit for the thickness of the ferroelectric film 6 for which an iridium-based material is used as the material for the upper electrode 7 can be decreased.

An iridium-based material has an advantage of having superior hydrogen barrier characteristics and fatigue characteristics in comparison with platinum (Pt).

(2) If the ferroelectric film is etched in a state in which unevenness is formed on the surface of the ferroelectric film, the unevenness formed on the surface of the ferroelectric film is transferred to the surface of the lower electrode, which is an underlay for the ferroelectric film. This causes the surface morphology of the lower electrode to deteriorate. If the surface morphology of the lower electrode deteriorates, a contact failure may occur between the interconnect layer to be connected to the lower electrode and the lower electrode.

However, the surface morphology of the ferroelectric film 6 is improved in the present embodiment. Therefore, deterioration of the surface morphology of the lower electrode 5 after etching the ferroelectric film 6 can be prevented. As a result, the interconnect layer 8a can be electrically connected to the lower electrode 9 reliably.

5 Modification

The ceramic film obtained by using the method of manufacturing a ceramic film of the present invention can be applied not only to the ferroelectric memory, but also to various types of semiconductor devices such as a DRAM. Specifically, the ceramic film of the present invention may be applied to a dielectric film for a capacitor of a DRAM. In this case, the dielectric film may be formed of a paraelectric having a high dielectric constant, such as BST, from the viewpoint of an increase in capacitance of the capacitors.

The ceramic film obtained by using the method of manufacturing a ceramic film of the present invention may be applied not only to semiconductor devices, but also to other applications such as a piezoelectric for piezoelectric devices used for actuators.

The present invention is described below in more detail by examples. The present invention is not limited to the following examples, and other examples are possible within the scope of the present invention.

EXAMPLE 1

A main liquid was obtained as follows. 1100 ml of a toluene solution of bismuth 2-ethylhexanoate at a concentration of 0.1 mol/l, 400 ml of a toluene solution of strontium 2-ethylhexanoate at a concentration of 0.1 mol/l, 1000 ml of a toluene solution of tantalum ethoxide at a concentration of 0.1 mol/l, and 100 g of 2-ethylhexanoic acid were mixed to prepare a mixed liquid. After refluxing the mixture while heating at 120° C. for one hour in a nitrogen atmosphere, the solvent was evaporated at atmospheric pressure. Toluene was added to the mixture so that the oxide concentration as $Sr_{0.8}Bi_{2.2}Ta_2O_X$ (SBT) was 0.1 mol/l to obtain a main liquid.

A secondary liquid was obtained as follows. 2000 ml of a toluene solution of bismuth 2-ethylhexanoate at a concentration of 0.1 mol/l, 1500 ml of a toluene solution of germanium ethoxide at a concentration of 0.1 mol/l, and 100 g of 2-ethylhexanoic acid were mixed. After refluxing the mixture while heating at 120° C. for one hour in a nitrogen atmosphere, the solvent was evaporated at atmospheric pressure. Toluene was added to the mixture so that the oxide concentration as $Bi_4Ge_3O_{12}$ was 0.1 mol/l to obtain a secondary liquid.

The main liquid and the secondary liquid thus obtained were mixed to obtain seven types of mixed liquids with different volume mixing ratios. The volume mixing ratios of the main liquid to the secondary liquid were 100:1, 100:10, 100:20, 100:50, 100:100, 100:150, and 100:200.

Ferroelectric films were formed from each of these seven types of mixed liquids and a solution containing only the main liquid.

Figure 9:
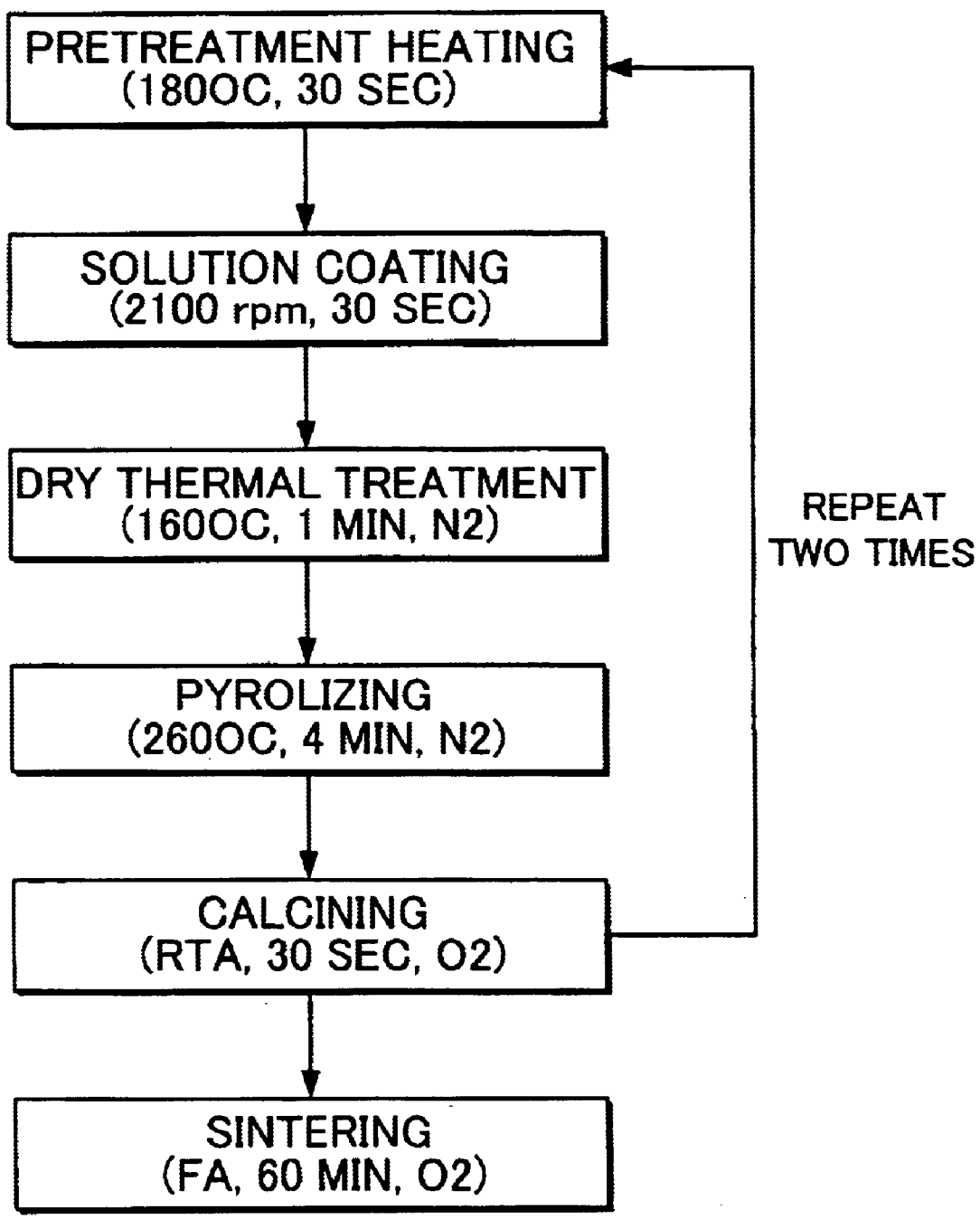
FIG. 9 is a flowchart of a deposition process.

The deposition method is shown in FIG. 9. A series of steps consisting of a pretreatment heating step, a solution coating step, a dry thermal treatment step, a pyrolizing step, and a calcining step was performed two times. The calcined product was sintered to form a film. Specific conditions are given below. The pretreatment heating step was performed at 180° C. for 30 seconds. The mixed liquid was applied for 30 seconds using a spin coater (2100 rpm). The dry thermal treatment step was performed at 160° C. for one minute in a nitrogen atmosphere. The pyrolizing step was performed at 260° C. for four minutes in a nitrogen atmosphere. Calcining was performed for 30 seconds in an oxygen atmosphere. The calcining temperature is shown in Table 1. Sintering was performed for 60 minutes in an oxygen atmosphere. The sintering temperature is shown in Table 1. The thickness of the deposited film was 50 nm.

The Pr (remanent polarization) of each ferroelectric film was measured. The measurement results for the Pr are shown in Table 1. The unit for Pr is $\mu C/cm^2$.

TABLE 1

| Volume mixing ratio (Main liquid: secondary liquid) | Sintering temperature | | | | |
| --- | --- | --- | --- | --- | --- |
| | 400° C. | 450° C. | 500° C. | 600° C. | 700° C. |
| Only main liquid | ND | ND | ND | ND | 8 |
| 100:1 | ND | ND | ND | ND | 9 |
| 100:10 | ND | 1 | 2 | 3 | 8 |
| 100:20 | ND | 3 | 7 | 9 | 9 |
| 100:50 | ND | 5 | 8 | 8 | 9 |
| 100:100 | ND | 3 | 7 | 9 | 8 |
| 100:150 | ND | 3 | 2 | 3 | 5 |
| 100:200 | ND | 2 | 3 | 3 | 4 |

ND: Not detectable

When manufacturing a ferroelectric memory device in which the ferroelectric is SBT, it is difficult to manufacture a ferroelectric memory device with a certain degree of integration if the sintering temperature is more than 600° C. In a ferroelectric memory device, the Pr of the ferroelectric capacitor is preferably 7 or more. In Table 1, the volume mixing ratio (main liquid:secondary liquid) at which a Pr of 7 or more was obtained at a sintering temperature of 600° C. or less is between 100:20 and 100:100. Therefore, the volume mixing ratio of the main liquid to the secondary liquid is preferably in the range from 100:20 to 100:100.

The main liquid was prepared so that 0.1 mol of $Sr_{0.8}Bi_{2.2}Ta_2O_X$ was produced per liter of the main liquid. The secondary liquid was prepared so that 0.1 mol of $Bi_4Ge_3O_{12}$ was produced per liter of the secondary liquid. Therefore, the volume mixing ratio of the main liquid to the secondary liquid shows the molar ratio of $Sr_{0.8}Bi_{2.2}Ta_2O_X$ produced from the main liquid to $Bi_4Ge_3O_{12}$ produced from the secondary liquid. Therefore, the main liquid and the secondary liquid are preferably mixed so that the molar ratio of $Sr_{0.8}Bi_{2.2}Ta_2O_X$ produced from the main liquid to $Bi_4Ge_3O_{12}$ produced from the secondary liquid is from 100:20 to 100:100.

In the case of a solution containing only the main liquid, specific characteristics relating to the Pr were not obtained at a sintering temperature of less than 700° C. On the contrary, in the case of mixing the secondary liquid with the main liquid, specific characteristics relating to the Pr were obtained even at a sintering temperature of about 500° C. This shows that the process temperature can be decreased by depositing a ferroelectric film by mixing the secondary liquid with the main liquid.

EXAMPLE 2

A main liquid was obtained as follows. 85.3 g of titanium isopropoxide and 139.2 g of bismuth butoxide were added to 1000 ml of 2-methoxyethanol. After refluxing the mixture while heating at 125° C. for one hour in a nitrogen atmosphere, the mixture was cooled to room temperature. After the addition of 23.7 g of lanthanum isopropoxide, the mixture was stirred at room temperature for two hours. After the addition of 1.3 g of water, the mixture was stirred at room temperature for one hour. 2-Methoxyethanol was added to the mixture so that the oxide concentration as $Bi_{3.25}La_{0.75}Ti_3O_{12}$ was 0.07 mol/l to obtain a main liquid.

A secondary liquid was obtained as follows. 75.9 g of germanium ethoxide and 171.3 g of bismuth butoxide were added to 1000 ml of 2-methoxyethanol. After refluxing the mixture while heating at 125° C. for one hour in a nitrogen atmosphere, the mixture was cooled to room temperature. After the addition of 1.3 g of water, the mixture was stirred at room temperature for one hour. 2-Methoxyethanol was added to the mixture so that the oxide concentration as $Bi_4Ge_3O_{12}$ was 0.07 mol/l to obtain a secondary liquid.

The main liquid and the secondary liquid thus obtained were mixed to obtain seven types of mixed liquids with different mixing ratios. The mixing ratios of the main liquid to the secondary liquid were 100:1, 100:10, 100:20, 100:50, 100:100, 100:150, and 100:200.

Ferroelectric films were formed from each of these seven types of mixed liquids and a solution containing only the main liquid. The deposition method was the same as in Example 1.

In Example 2, the same tendency as in Example 1 was observed relating to the Pr.

EXAMPLE 3

A main liquid was obtained as follows. 81.2 g of tantalum ethoxide and 170 g of 2-ethylhexanoic acid were added to 100 ml of xylene. After the addition of 20.6 g strontium isopropoxide, the mixture was stirred at 120° C. for two hours. Xylene, the resulting alcohols, and excess 2-ethylhexanoic acid were evaporated at 180° C. under atmospheric pressure. 200 ml of a xylene solution of bismuth 2-ethylhexanoate at a concentration of 1.0 mol/l was added to the mixture. Xylene was added to the mixture so that the oxide concentration as $SrBi_2Ta_2O_X$ was 0.2 mol/l. Then, butyl acetate was added to the mixture so that the oxide concentration as $SrBi_2Ta_2O_X$ was 0.1 mol/l to obtain a main liquid.

A secondary liquid was obtained as follows. 500 ml of a xylene solution of tungsten ethoxide at a concentration of 0.1 mol/l and 100 g of 2-ethylhexanoic acid were mixed with 1000 ml of a xylene solution of bismuth 2-ethylhexanoate at a concentration of 0.1 mol/l. After refluxing the mixture while heating at 120° C. for one hour in a nitrogen atmosphere, the solvent was evaporated at atmospheric pressure. Xylene was added to the mixture so that the oxide concentration as $Bi_2WO_6$ was 0.1 mol/l to obtain a secondary liquid.

The main liquid and the secondary liquid thus obtained were mixed to obtain seven types of mixed liquids with different volume mixing ratios. The volume mixing ratios of the main liquid to the secondary liquid were 100:1, 100:10, 100:20, 100:50, 100:100, 100:150, and 100:200.

Ferroelectric films were formed from each of these seven types of mixed liquids and a solution containing only the main liquid. The deposition method was the same as in Example 1.

In Example 3, the same tendency as in Example 1 was observed relating to the Pr.

EXAMPLE 4

A main liquid was obtained as follows. 37.93 g of lead acetate trihydrate, 19.95 g of zirconium butoxide, and 13.64 g of titanium isopropoxide were added to 100 ml of 1-methoxy-2-propanol. The mixture was refluxed while heating at 120° C. for one hour in a nitrogen atmosphere. After the addition of 4.5 g of acetylacetone and 1.1 g of water, the solvent was evaporated at atmospheric pressure.

1-Methoxy-2-propanol was added to the mixture so that the oxide concentration as $Pb(Zr_{0.52}Ti_{0.48})O_3$ was 0.3 mol/l to obtain a main liquid.

A secondary liquid was obtained as follows. 200 ml of a 1-methoxy-2-propanol solution of germanium ethoxide at a concentration of 0.5 mol/l and 250 ml of a 1-methoxy-2-propanol solution of lead butoxide at a concentration of 0.5 mol/l were mixed. After refluxing the mixture while heating at 120° C. for one hour in a nitrogen atmosphere, the mixture was cooled to room temperature. After the addition of 4.1 g of acetylacetone and 1.0 g of water, the solvent was evaporated at atmospheric pressure. 1-Methoxy-2-propanol was added to the mixture so that the oxide concentration as $Pb_5Ge_3O_{11}$ was 0.15 mol/l to obtain a secondary liquid.

The main liquid and the secondary liquid thus obtained were mixed to obtain seven types of mixed liquids with different volume mixing ratios. The volume mixing ratios of the main liquid to the secondary liquid were 100:1, 100:10, 100:20, 100:50, 100:100, 100:150, and 100:200.

Ferroelectric films were formed from each of these seven types of mixed liquids and a solution containing only the main liquid. The deposition method was the same as in Example 1.

In Example 4, the same tendency as in Example 1 was observed relating to the Pr.

Experimental Example Relating to Surface Morphology

Experimental results for surface morphology are described below.

Figure 10:
FIG. 10 is a micrograph of a ferroelectric film obtained from a mixed liquid of a main liquid and a secondary liquid according to Example 1.
Figure 11:
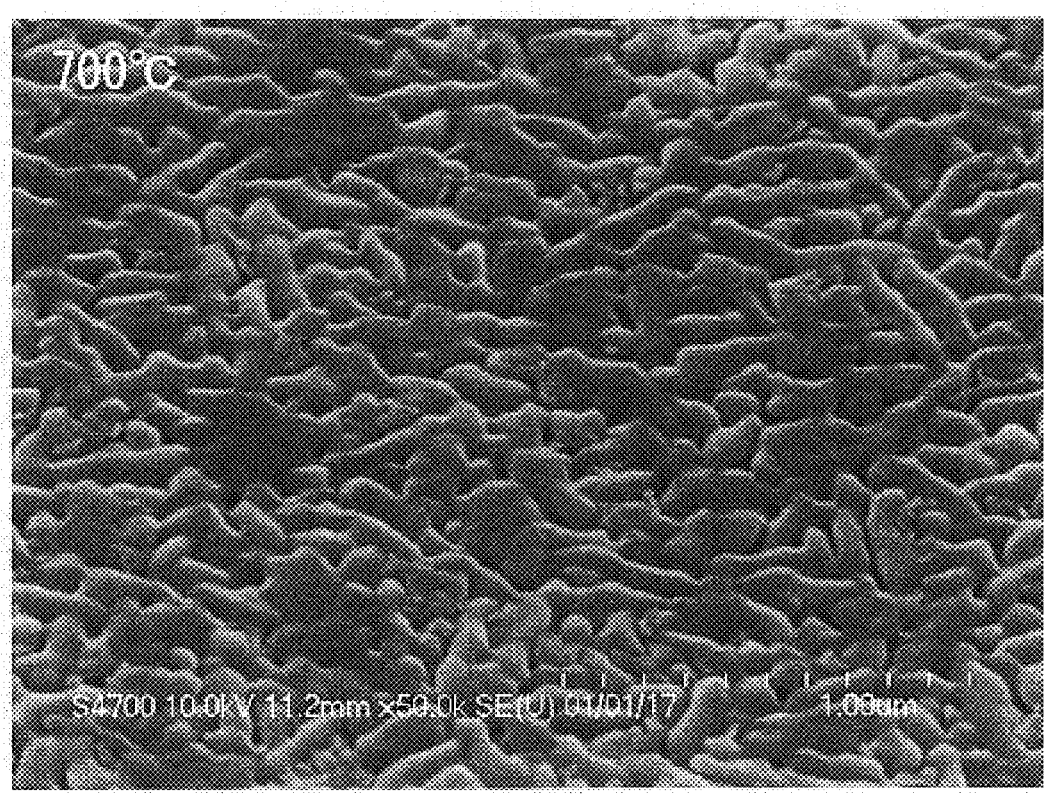
FIG. 11 is a micrograph of a ferroelectric film according to a comparative example.

FIG. 10 is a micrograph of the ferroelectric film obtained from the mixed liquid of the main liquid and the secondary liquid according to Example 1. FIG. 11 is a micrograph of a ferroelectric film according to a comparative example.

The ferroelectric film according to Example 1 shown in FIG. 10 is a ferroelectric film in which the volume mixing ratio of the main liquid to the secondary liquid is 100:100. The ferroelectric film according to the comparative example was obtained by depositing a solution containing only the main liquid illustrated in Example 1 using the deposition method of Example 1. The thickness of the ferroelectric films was 50 nm in both Examples and comparative example.

As shown in FIGS. 10 and 11, the surface morphology of the ferroelectric film according to Example was significantly improved in comparison with the ferroelectric film according to the comparative example.

Various modifications and variations of the present invention are possible within the scope of the above embodiments.

What is claimed is:

1. A ferroelectric ceramic film, comprising:

a stack in which a first crystal layer and a second crystal layer are sequentially layered, the first crystal layer being formed on a base with a third crystal layer interposed therebetween, the second crystal layer having a melting point lower than a melting point of the first crystal layer, the first crystal layer having a Bi-based perovskite structure, and the second crystal layer having ABO-type oxides in which Bi is provided in an A-site and Si or Ge is provided in a B-site, and the third crystal layer having a melting point lower than a melting point of the first crystal layer.

2. The ferroelectric ceramic film as defined in claim 1, a constituent metal element of the first crystal layer and a constituent metal element of the second crystal layer being mixed in an interface region between the first crystal layer and the second crystal layer.

3. A ferroelectric ceramic film, comprising:

a crystal stack in which a first crystal layer, a second crystal layer, and a third crystal layer are sequentially layered, the second crystal layer having a melting point lower than melting points of the first crystal layer and the third crystal layer, the first crystal layer having a Bi-based perovskite structure, and the second crystal layer having ABO-type oxides in which Bi is provided in an A-site and Si or Ge is provided in a B-site.

4. The ferroelectric ceramic film as defined in claim 3, a constituent metal element of the first crystal layer and a constituent metal element of the second crystal layer being mixed in a first interface region between the first crystal layer and the second crystal layer, and a constituent metal element of the second crystal layer and a constituent metal element of the third crystal layer being mixed in a second interface region between the second crystal layer and the third crystal layer.

5. The ferroelectric ceramic film as defined in claim 3, a fourth crystal layer being further provided on the third crystal layer, the fourth crystal layer having a melting point lower than a melting point of the third crystal layer, and a constituent metal element of the third crystal layer and a constituent metal element of the fourth crystal layer being mixed in an interface region between the third crystal layer and the fourth crystal layer.

6. A semiconductor device comprising a capacitor including the ferroelectric ceramic film as defined claim 1.

7. An element, comprising:

the ferroelectric ceramic film as defined in claim 1.

* * * * *